(12) United States Patent
Volkerink et al.

(10) Patent No.: US 11,879,624 B1
(45) Date of Patent: Jan. 23, 2024

(54) WIRELESS SENSOR DEVICE AND SYSTEM THEREOF FOR LIGHT BULB DIAGNOSTICS USING A LIGHT SENSOR OF AN ADHESIVE TAPE PLATFORM

(71) Applicant: Trackonomy Systems, Inc., San Jose, CA (US)

(72) Inventors: Hendrik J Volkerink, Palo Alto, CA (US); Ajay Khoche, West San Jose, CA (US)

( * ) Notice: Subject to any disclaimer, the term of this patent is extended or adjusted under 35 U.S.C. 154(b) by 179 days.

(21) Appl. No.: 17/494,818

(22) Filed: Oct. 5, 2021

Related U.S. Application Data

(60) Provisional application No. 63/087,327, filed on Oct. 5, 2020.

(51) Int. Cl.
| | | |
|---|---|---|
| *F21V 23/04* | (2006.01) | |
| *G01J 3/457* | (2006.01) | |
| *G01R 31/317* | (2006.01) | |
| *G01R 31/26* | (2020.01) | |
| *F21Y 115/30* | (2016.01) | |
| *F21Y 115/15* | (2016.01) | |

(52) U.S. Cl.
CPC .......... *F21V 23/0457* (2013.01); *G01J 3/457* (2013.01); *G01R 31/2635* (2013.01); *G01R 31/31728* (2013.01); *F21Y 2115/15* (2016.08); *F21Y 2115/30* (2016.08)

(58) Field of Classification Search
CPC .. F21V 23/0457; G01J 3/457; G01R 31/2635; G01R 31/31728; F21Y 2115/15; F21Y 2115/30
USPC .................................. 250/205, 208.1, 214 R
See application file for complete search history.

(56) References Cited

U.S. PATENT DOCUMENTS

| | | | |
|---|---|---|---|
| 6,375,780 B1 * | 4/2002 | Tuttle .................... | G01S 13/825 |
| | | | 156/227 |
| 10,262,255 B2 | 4/2019 | Khoche | |
| 10,885,420 B2 | 1/2021 | Khoche | |
| 10,902,310 B2 | 1/2021 | Khoche | |

* cited by examiner

*Primary Examiner* — Que Tan Le
*Assistant Examiner* — Mai Thi Ngoc Tran

(57) ABSTRACT

A method of detecting a condition of a light source includes adhering an adhesive tape platform in a vicinity of the light source; detecting light emitted from the light source that is incident to a light sensor of the adhesive tape platform; in response to the detecting light, determining that the light source is functioning correctly; and transmitting a report indicating that the light source is functioning to another node of an associated Internet of Things (IOT) system.

14 Claims, 15 Drawing Sheets

US 11,879,624 B1

WIRELESS SENSOR DEVICE AND SYSTEM THEREOF FOR LIGHT BULB DIAGNOSTICS USING A LIGHT SENSOR OF AN ADHESIVE TAPE PLATFORM

CROSS-REFERENCE TO RELATED APPLICATIONS

This application claims priority to U.S. Provisional Patent Application No. 63/087,327, filed on Oct. 5, 2020, which is incorporated herein in its entirety.

FIELD OF THE DISCLOSURE

This disclosure generally relates to wireless internet of things (IOT) devices, and more specifically to wireless sensor devices.

BACKGROUND

In an environment, it may be useful to detect when a light source is malfunctioning. For example, maintenance light sources, such as light bulbs and other light emitting devices, in an environment may require monitoring the condition of a large number. Electrical methods based on measuring voltage or current running through a lightbulb or other light emitting element for detecting the condition of a lightbulb or other light emitting element (e.g., functioning or malfunctioning, brightness, etc.) are ineffective in situations where the lightbulb or other light emitting element has current flowing through it, but is still not emitting light.

SUMMARY

A method and system is disclosed for detecting a condition of a lightbulb using an adhesive tape platform that detects light being emitted from the lightbulb.

A method of detecting a condition of a light source includes adhering an adhesive tape platform in a vicinity of the light source; detecting light emitted from the light source that is incident to a light sensor of the adhesive tape platform; in response to the detecting light, determining that the light source is functioning correctly; and transmitting a report indicating that the light source is functioning to another node of an associated Internet of Things (IOT) system.

A flexible light sensing device is closed which includes a flexible substrate; a flexible cover layer covering the flexible substrate; a device layer between the flexible substrate and the flexible cover layer, the device layer, a battery, and a flexible circuit connecting components of the device layer and the battery. The device layer includes a processor, a memory coupled to the processor, a first wireless communication system, and a light sensor exposed through an aperture in the flexible cover layer that overlaps the light sensor, the light sensor facing the exterior of the light sensing device and configured to receive light. The first wireless communication system may include one or more of a Bluetooth, Bluetooth Low Energy (BLE), WiFi, Long Range (LoRa), LoRaWAN, cellular, satellite, and GPS communication system. The light sensing device is configured to be adhered in a vicinity of a light source and detect the condition of the light source based on detected light incident at the light sensor. The flexible light sensing device may be an embodiment of an adhesive tape platform.

A method of detecting a condition of an equipment asset includes adhering an adhesive tape platform to a portion of the equipment asset and, based on detecting light from an indicator light of the equipment asset at a light sensor of the adhesive tape platform, determining that the equipment asset is malfunctioning.

DETAILED DESCRIPTION

Figure 1A:
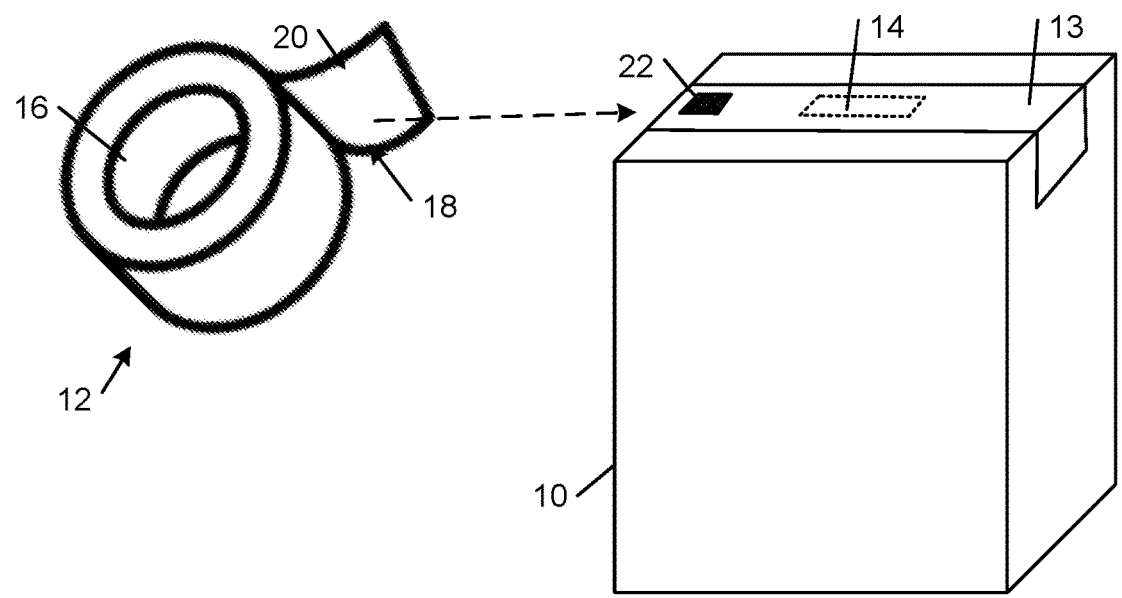
FIG. 1A is a diagrammatic view of an asset that has been sealed for shipment using a segment of an example adhesive tape platform dispensed from a roll, according to some embodiments.

A wireless sensor device is disclosed that detects the light emissions from a light source using a light sensor and determines a condition of the light source based on the detected light emissions. The wireless sensor device includes at least one wireless communication system for wirelessly transmitting data on the light source to one or more nodes of a wireless IOT system. The wireless sensor may detect a malfunctioning or degradation of the light source that may not be detected using detection methods that rely on measuring the electrical current draw or voltage associated with the light source.

In some embodiments, the wireless sensor device is an adhesive tape platform or a segment thereof. The adhesive tape platform includes wireless transducing components and circuitry that perform communication and/or sensing. The adhesive tape platform has a flexible adhesive tape form-factor that allows it to function as both an adhesive tape for adhering to and/or sealing objects and a wireless sensing device.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements and are not drawn to scale.

As used herein, the term "or" refers to an inclusive "or" rather than an exclusive "or." In addition, the articles "a" and "an" as used in the specification and claims mean "one or more" unless specified otherwise or clear from the context to refer the singular form.

The term "tape node" refers to an adhesive tape platform or a segment thereof that is equipped with sensor, processor, memory, energy source/harvesting mechanism, and wireless communications functionality, where the adhesive tape platform (also referred to herein as an "adhesive product" or an "adhesive tape product") has a variety of different form factors, including a multilayer roll or a sheet that includes a plurality of divisible adhesive segments. Once deployed, each tape node can function, for example, as an adhesive tape, label, sticker, decal, or the like, and as a wireless communications device.

The terms "adhesive tape node," "wireless node," or "tape node" may be used interchangeably in certain contexts, and refer to an adhesive tape platform or a segment thereof that is equipped with sensor, processor, memory, energy source/harvesting mechanism, and wireless communications functionality, where the adhesive product has a variety of different form factors, including a multilayer roll or a sheet that includes a plurality of divisible adhesive segments. Once deployed, each tape node or wireless node can function, for example, as an adhesive tape, label, sticker, decal, or the like, and as a wireless communications device. A "peripheral" tape node or wireless node, also referred to as an outer node, leaf node, or terminal node, refers to a node that does not have any child nodes.

In certain contexts, the terms "parcel," "envelope," "box," "package," "container," "pallet," "carton," "wrapping," and the like are used interchangeably herein to refer to a packaged item or items.

In certain contexts, the terms "wireless tracking system," "hierarchical communications network," "distributed agent operating system," and the like are used interchangeably herein to refer to a system or network of wireless nodes.

INTRODUCTION

This specification describes a low-cost, multi-function adhesive tape platform with a form factor that unobtrusively integrates the components useful for implementing a combination of different asset tracking and management functions and also is able to perform a useful ancillary function that otherwise would have to be performed with the attendant need for additional materials, labor, and expense. In an aspect, the adhesive tape platform is implemented as a collection of adhesive products that integrate wireless communications and sensing components within a flexible adhesive structure in a way that not only provides a cost-effective platform for interconnecting, optimizing, and protecting the components of the tracking system but also maintains the flexibility needed to function as an adhesive product that can be deployed seamlessly and unobtrusively into various asset management and tracking applications and workflows, including person and object tracking applications, and asset management workflows such as manufacturing, storage, shipping, delivery, and other logistics associated with moving products and other physical objects, including logistics, sensing, tracking, locationing, warehousing, parking, safety, construction, event detection, road management and infrastructure, security, and healthcare. In some examples, the adhesive tape platforms are used in various aspects of asset management, including sealing assets, transporting assets, tracking assets, monitoring the conditions of assets, inventorying assets, and verifying asset security. In these examples, the assets typically are transported from one location to another by truck, train, ship, or aircraft or within premises, e.g., warehouses by forklift, trolleys etc.

In disclosed examples, an adhesive tape platform includes a plurality of segments that can be separated from the adhesive product (e.g., by cutting, tearing, peeling, or the like) and adhesively attached to a variety of different surfaces to inconspicuously implement any of a wide variety of different wireless communications based network communications and transducing (e.g., sensing, actuating, etc.) applications. Examples of such applications include: event detection applications, monitoring applications, security applications, notification applications, and tracking applications, including inventory tracking, asset tracking, person tracking, animal (e.g., pet) tracking, manufactured parts tracking, and vehicle tracking. In example embodiments, each segment of an adhesive tape platform is equipped with an energy source, wireless communication functionality, transducing functionality, and processing functionality that enable the segment to perform one or more transducing functions and report the results to a remote server or other computer system directly or through a network of tapes. The components of the adhesive tape platform are encapsulated within a flexible adhesive structure that protects the components from damage while maintaining the flexibility needed to function as an adhesive tape (e.g., duct tape or a label) for use in various applications and workflows. In addition to single function applications, example embodiments also include multiple transducers (e.g., sensing and/or actuating transducers) that extend the utility of the platform by, for example, providing supplemental information and functionality relating characteristics of the state and or environment of, for example, an article, object, vehicle, or person, over time.

Systems and processes for fabricating flexible multifunction adhesive tape platforms in efficient and low-cost ways also are described. In addition to using roll-to-roll and/or sheet-to-sheet manufacturing techniques, the fabrication systems and processes are configured to optimize the placement and integration of components within the flexible adhesive structure to achieve high flexibility and ruggedness. These fabrication systems and processes are able to create useful and reliable adhesive tape platforms that can provide local sensing, wireless transmitting, and locationing functionalities. Such functionality together with the low cost of production is expected to encourage the ubiquitous deployment of adhesive tape platform segments and thereby alleviate at least some of the problems arising from gaps in conventional infrastructure coverage that prevent continuous monitoring, event detection, security, tracking, and other asset tracking and management applications across heterogeneous environments.

Adhesive Tape Platform

FIG. 1A shows an example asset 10 that is sealed for shipment using an example adhesive tape platform 12 that includes embedded components of a wireless transducing circuit 14 (collectively referred to herein as a "tape node"). In this example, a length 13 of the adhesive tape platform 12 is dispensed from a roll 16 and affixed to the asset 10. The adhesive tape platform 12 includes an adhesive side 18 and a non-adhesive side 20. The adhesive tape platform 12 can be dispensed from the roll 16 in the same way as any conventional packing tape, shipping tape, or duct tape. For example, the adhesive tape platform 12 may be dispensed from the roll 16 by hand, laid across the seam where the two top flaps of the asset 10 meet, and cut to a suitable length either by hand or using a cutting instrument (e.g., scissors or an automated or manual tape dispenser). Examples of such tapes include tapes having non-adhesive sides 20 that carry one or more coatings or layers (e.g., colored, light reflective, light absorbing, and/or light emitting coatings or layers).

Figure 1B:
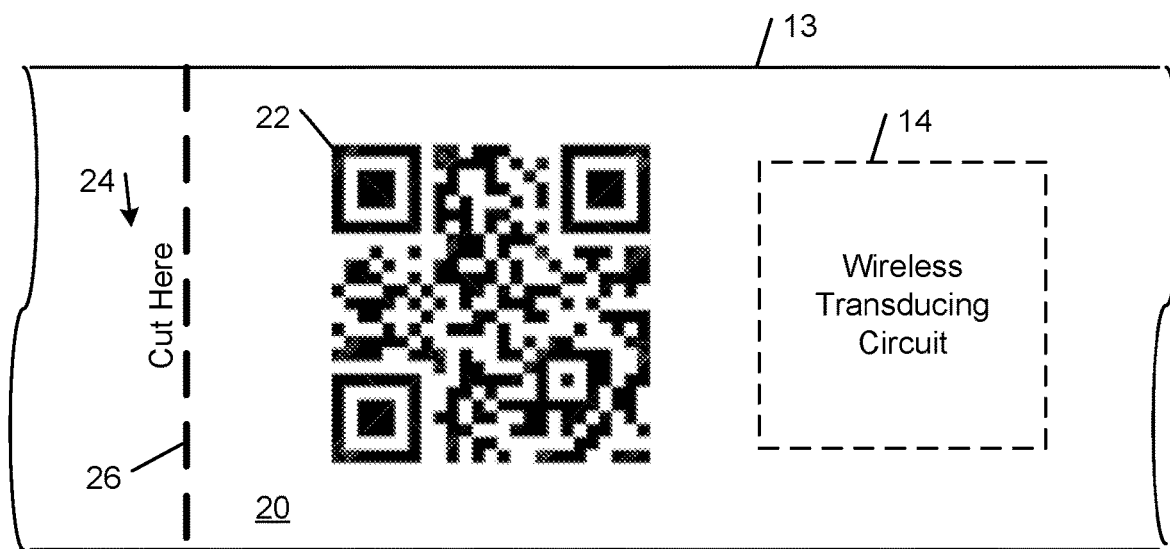
FIG. 1B is a diagrammatic top view of a portion of the segment of the example adhesive tape platform shown in FIG. 1A, according to some embodiments.

Referring to FIG. 1B, in some examples, the non-adhesive side 20 of the length 13 of the adhesive tape platform 12 includes writing or other markings that convey instructions, warnings, or other information to a person or machine (e.g., a bar code reader), or may simply be decorative and/or entertaining. For example, different types of adhesive tape platforms may be marked with distinctive colorations to distinguish one type of adhesive tape platform from another. In the illustrated example, the length 13 of the adhesive tape platform 12 includes a two-dimensional bar code (e.g., a QR Code) 22, written instructions 24 (i.e., "Cut Here"), and an associated cut line 26 that indicates where the user should cut the adhesive tape platform 12. The written instructions 24 and the cut line 26 typically are printed or otherwise marked on the top non-adhesive surface 20 of the adhesive tape platform 12 during manufacture. The two-dimensional bar code 22, on the other hand, may be marked on the non-adhesive surface 20 of the adhesive tape platform 12 during the manufacture of the adhesive product 12 or, alternatively, may be marked on the non-adhesive surface 20 of the adhesive tape platform 12 as needed using, for example, a printer or other marking device.

In order to avoid damage to the functionality of the segments of the adhesive tape platform 12, the cut lines 26 typically demarcate the boundaries between adjacent segments at locations that are free of any active components of the wireless transducing circuit 14. The spacing between the wireless transducing circuit components 14 and the cut lines 26 may vary depending on the intended communication, transducing and/or adhesive taping application. In the example illustrated in FIG. 1A, the length of the adhesive tape platform 12 that is dispensed to seal the asset 10 corresponds to a single segment of the adhesive tape platform 12. In other examples, the length of the adhesive tape platform 12 needed to seal a asset or otherwise serve the adhesive function for which the adhesive tape platform 12 is being applied may include multiple segments 13 of the adhesive tape platform 12, one or more of which segments 13 may be activated upon cutting the length of the adhesive tape platform 12 from the roll 16 and/or applying the length of the adhesive tape platform to the asset 10.

In some examples, the transducing components 14 that are embedded in one or more segments 13 of the adhesive tape platform 12 are activated when the adhesive tape platform 12 is cut along the cut line 26. In these examples, the adhesive tape platform 12 includes one or more embedded energy sources (e.g., thin film batteries, which may be printed, or conventional cell batteries, such as conventional watch style batteries, rechargeable batteries, or other energy storage device, such as a super capacitor or charge pump) that supply power to the transducing components 14 in one or more segments of the adhesive tape platform 12 in response to being separated from the adhesive tape platform 12 (e.g., along the cut line 26).

In some examples, each segment 13 of the adhesive tape platform 12 includes its own respective energy source including energy harvesting elements that can harvest energy from the environment. In some of these examples, each energy source is configured to only supply power to the components in its respective adhesive tape platform segment regardless of the number of contiguous segments 13 that are in a given length of the adhesive tape platform 12. In other examples, when a given length of the adhesive tape platform 12 includes multiple segments 13, the energy sources in the respective segments 13 are configured to supply power to the transducing components 14 in all of the segments 13 in the given length of the adhesive tape platform 12. In some of these examples, the energy sources are connected in parallel and concurrently activated to power the transducing components 14 in all of the segments 13 at the same time. In other examples, the energy sources are connected in parallel and alternately activated to power the transducing components 14 in respective ones of the adhesive tape platform segments 13 at different time periods, which may or may not overlap.

Figure 2:
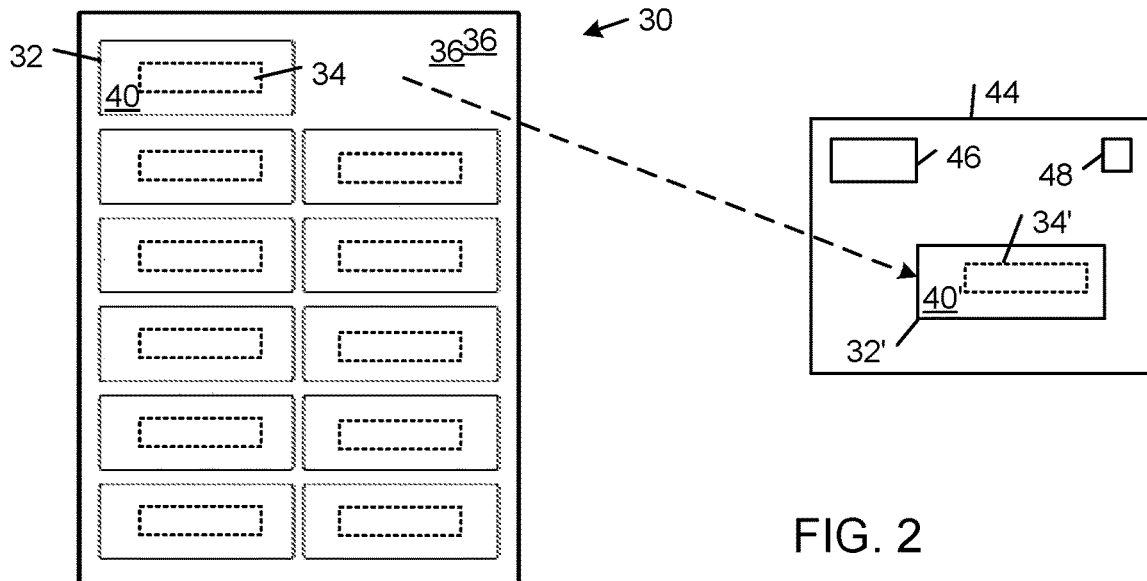
FIG. 2 is a diagrammatic view of an example of an envelope carrying a segment of an example adhesive tape platform dispensed from a backing sheet, according to some embodiments.

FIG. 2 shows an example adhesive tape platform 30 that includes a set of adhesive tape platform segments 32 each of which includes a respective set of embedded wireless transducing circuit components 34, and a backing sheet 36 with a release coating that prevents the adhesive segments 32 from adhering strongly to the backing sheet 36. Each adhesive tape platform segment 32 includes an adhesive side facing the backing sheet 36, and an opposing non-adhesive side 40. In this example, a particular segment 32' of the adhesive tape platform 30 has been removed from the backing sheet 36 and affixed to an envelope 44. Each segment 32 of the adhesive tape platform 30 can be removed from the backing sheet 36 in the same way that adhesive labels can be removed from a conventional sheet of adhesive labels (e.g., by manually peeling a segment 32 from the backing sheet 36). In general, the non-adhesive side 40' of the segment 32' may include any type of writing, markings, decorative designs, or other ornamentation. In the illustrated example, the non-adhesive side 40' of the segment 32' includes writing or other markings that correspond to a destination address for the envelope 44. The envelope 44 also includes a return address 46 and, optionally, a postage stamp or mark 48.

In some examples, segments of the adhesive tape platform 12 are deployed by a human operator. The human operator may be equipped with a mobile phone or other device that allows the operator to authenticate and initialize the adhesive tape platform 12. In addition, the operator can take a picture of a asset including the adhesive tape platform and any barcodes associated with the asset and, thereby, create a persistent record that links the adhesive tape platform 12 to the asset. In addition, the human operator typically will send the picture to a network service and/or transmit the picture to the adhesive tape platform 12 for storage in a memory component of the adhesive tape platform 12.

In some examples, the wireless transducing circuit components 34 that are embedded in a segment 32 of the adhesive tape platform 12 are activated when the segment 32 is removed from the backing sheet 32. In some of these examples, each segment 32 includes an embedded capacitive sensing system that can sense a change in capacitance when the segment 32 is removed from the backing sheet 36. As explained in detail below, a segment 32 of the adhesive tape platform 30 includes one or more embedded energy sources (e.g., thin film batteries, common disk-shaped cell batteries, or rechargeable batteries or other energy storage devices, such as a super capacitor or charge pump) that can be configured to supply power to the wireless transducing circuit components 34 in the segment 32 in response to the detection of a change in capacitance between the segment 32 and the backing sheet 36 as a result of removing the segment 32 from the backing sheet 36.

Figure 3:
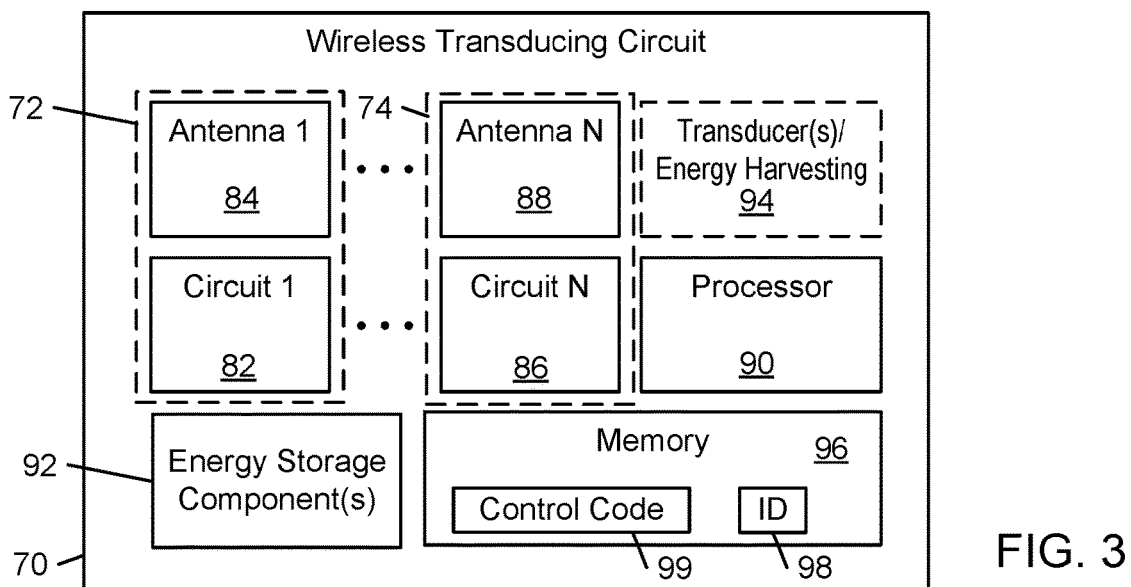
FIG. 3 is a schematic view of an example segment of an adhesive tape platform, according to some embodiments.

FIG. 3 shows a block diagram of the components of an example wireless transducing circuit 70 that includes a number of communication systems 72, 74. Example communication systems 72, 74 include a GPS system that includes a GPS receiver circuit 82 (e.g., a receiver integrated circuit) and a GPS antenna 84, and one or more wireless communication systems each of which includes a respective transceiver circuit 86 (e.g., a transceiver integrated circuit) and a respective antenna 88. Example wireless communication systems include a cellular communication system (e.g., GSM/GPRS), a Wi-Fi communication system, an RF communication system (e.g., LoRa), a Bluetooth communication system (e.g., a Bluetooth Low Energy system), a Z-wave communication system, and a ZigBee communication system. The wireless transducing circuit 70 also includes a processor 90 (e.g., a microcontroller or microprocessor), one or more energy storage devices 92 (e.g., non-rechargeable or rechargeable printed flexible battery, conventional single or multiple cell battery, and/or a super capacitor or charge pump), one or more transducers 94 (e.g., sensors and/or actuators, and, optionally, one or more energy harvesting transducer components). In some examples, the conventional single or multiple cell battery may be a watch style disk or button cell battery that is associated electrical connection apparatus (e.g., a metal clip) that electrically connects the electrodes of the battery to contact pads on the flexible circuit 116.

Examples of sensing transducers 94 include a capacitive sensor, an altimeter, a gyroscope, an accelerometer, a temperature sensor, a strain sensor, a pressure sensor, a piezoelectric sensor, a weight sensor, an optical or light sensor (e.g., a photodiode or a camera), an acoustic or sound sensor (e.g., a microphone), a smoke detector, a radioactivity sensor, a chemical sensor (e.g., an explosives detector), a biosensor (e.g., a blood glucose biosensor, odor detectors, antibody based pathogen, food, and water contaminant and toxin detectors, DNA detectors, microbial detectors, pregnancy detectors, and ozone detectors), a magnetic sensor, an electromagnetic field sensor, and a humidity sensor. Examples of actuating (e.g., energy emitting) transducers 94 include light emitting components (e.g., light emitting diodes and displays), electro-acoustic transducers (e.g., audio speakers), electric motors, and thermal radiators (e.g., an electrical resistor or a thermoelectric cooler).

In some examples, the wireless transducing circuit 70 includes a memory 96 for storing data, including, e.g., profile data, state data, event data, sensor data, localization data, security data, and one or more unique identifiers (ID) 98 associated with the wireless transducing circuit 70, such as a product ID, a type ID, and a media access control (MAC) ID, and control code 99. In some examples, the memory 96 may be incorporated into one or more of the processor 90 or transducers 94, or may be a separate component that is integrated in the wireless transducing circuit 70 as shown in FIG. 3. The control code typically is implemented as programmatic functions or program modules that control the operation of the wireless transducing circuit 70, including a tape node communication manager that manages the manner and timing of tape node communications, a tape node power manager that manages power consumption, and a tape node connection manager that controls whether connections with other tape nodes are secure connections or unsecure connections, and a tape node storage manager that securely manages the local data storage on the node. The tape node connection manager ensures the level of security required by the end application and supports various encryption mechanisms. The tape node power manager and tape communication manager work together to optimize the battery consumption for data communication. In some examples, execution of the control code by the different types of tape nodes described herein may result in the performance of similar or different functions.

Figure 4:
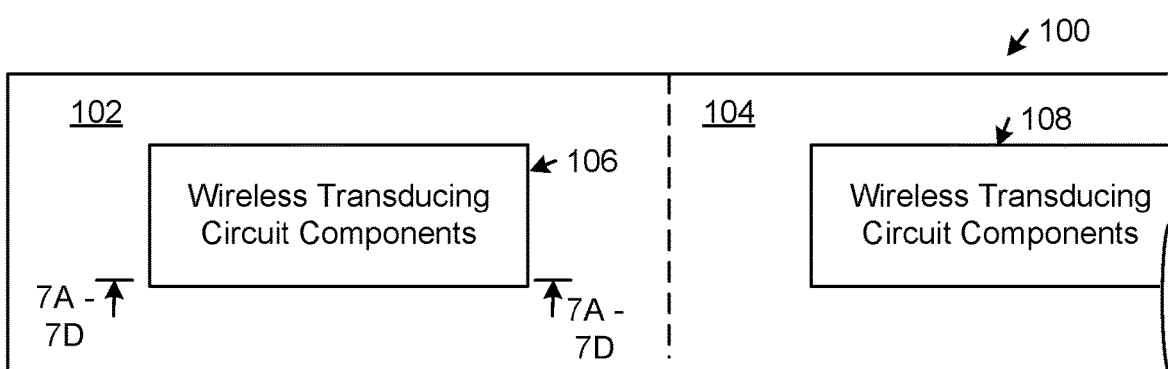
FIG. 4 is a diagrammatic top view of a length of an example adhesive tape platform, according to some embodiments.

FIG. 4 is a top view of a portion of an example flexible adhesive tape platform 100 that shows a first segment 102 and a portion of a second segment 104. Each segment 102, 104 of the flexible adhesive tape platform 100 includes a respective set 106, 108 of the components of the wireless transducing circuit 70. The segments 102, 104 and their respective sets of components 106, 108 typically are identical and configured in the same way. In some other embodiments, however, the segments 102, 104 and/or their respective sets of components 106, 108 are different and/or configured in different ways. For example, in some examples, different sets of the segments of the flexible adhesive tape platform 100 have different sets or configurations of tracking and/or transducing components that are designed and/or optimized for different applications, or different sets of segments of the flexible adhesive tape platform may have different ornamentations (e.g., markings on the exterior surface of the platform) and/or different (e.g., alternating) lengths.

An example method of fabricating the adhesive tape platform 100 (see FIG. 4) according to a roll-to-roll fabrication process is described in connection with FIGS. 6, 7A, and 7B of U.S. Pat. No. 10,262,255, issued Apr. 16, 2019, the entirety of which is incorporated herein by reference.

The instant specification describes an example system of adhesive tape platforms (also referred to herein as "tape nodes") that can be used to implement a low-cost wireless network infrastructure for performing monitoring, tracking, and other asset management functions relating to, for example, parcels, persons, tools, equipment and other physical assets and objects. The example system includes a set of three different types of tape nodes that have different respective functionalities and different respective cover markings that visually distinguish the different tape node types from one another. In one non-limiting example, the covers of the different tape node types are marked with different colors (e.g., white, green, and black). In the illustrated examples, the different tape node types are distinguishable from one another by their respective wireless communications capabilities and their respective sensing capabilities.

Figure 5A:
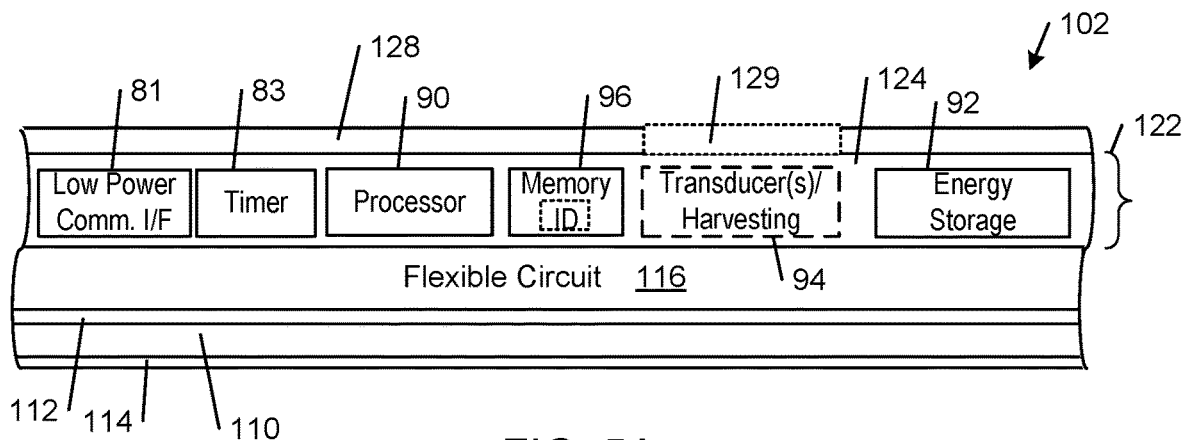
FIGS. 5A-5C show diagrammatic cross-sectional side views of portions of different respective adhesive tape platforms, according to some embodiments.

FIG. 5A shows a cross-sectional side view of a portion of an example segment 102 of the flexible adhesive tape platform 100 that includes a respective set of the components of the wireless transducing circuit 106 corresponding to the first tape node type (i.e., white). The flexible adhesive tape platform segment 102 includes an adhesive layer 112, an optional flexible substrate 110, and an optional adhesive layer 114 on the bottom surface of the flexible substrate 110. If the bottom adhesive layer 114 is present, a release liner (not shown) may be (weakly) adhered to the bottom surface of the adhesive layer 114. In some examples, the adhesive layer 114 includes an adhesive (e.g., an acrylic foam adhesive) that has a high bond strength that is sufficient to prevent removal of the adhesive segment 102 from a surface on which the adhesive layer 114 is adhered without destroying the physical or mechanical integrity of the adhesive segment 102 and/or one or more of its constituent components. In some examples, the optional flexible substrate 110 is implemented as a prefabricated adhesive tape that includes the adhesive layers 112, 114 and the optional release liner. In other examples, the adhesive layers 112, 114 are applied to the top and bottom surfaces of the flexible substrate 110 during the fabrication of the adhesive tape platform 100. The adhesive layer 112 bonds the flexible substrate 110 to a bottom surface of a flexible circuit 116, that includes one or more wiring layers (not shown) that connect the processor 90, a low power wireless communication interface 81 (e.g., a Zigbee, Bluetooth® Low Energy (BLE) interface, or other low power communication interface), a timer circuit 83, transducing and/or energy harvesting component(s) 94 (if present), the memory 96, and other components in a device layer 122 to each other and to the energy storage component 92 and, thereby, enable the transducing, tracking and other functionalities of the flexible adhesive tape platform segment 102. The low power wireless communication interface 81 typically includes one or more of the antennas 84, 88 and one or more of the wireless circuits 82, 86.

Figure 5B:
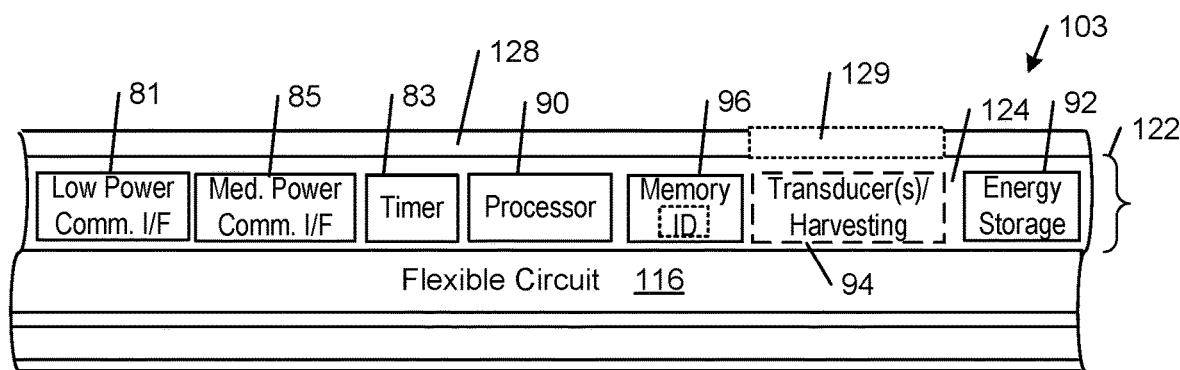

FIG. 5B shows a cross-sectional side view of a portion of an example segment 103 of the flexible adhesive tape platform 100 that includes a respective set of the components of the wireless transducing circuit 106 corresponding to the second tape node type (i.e., green). In this example, the flexible adhesive tape platform segment 103 differs from the segment 102 shown in FIG. 5A by the inclusion of a medium power communication interface 85 (e.g., a LoRa interface) in addition to the low power communications interface that is present in the first tape node type (i.e., white). The medium power communication interface has longer communication range than the low power communication interface. In some examples, one or more other components of the flexible adhesive tape platform segment 103 differ, for example, in functionality or capacity (e.g., larger energy source).

Figure 5C:
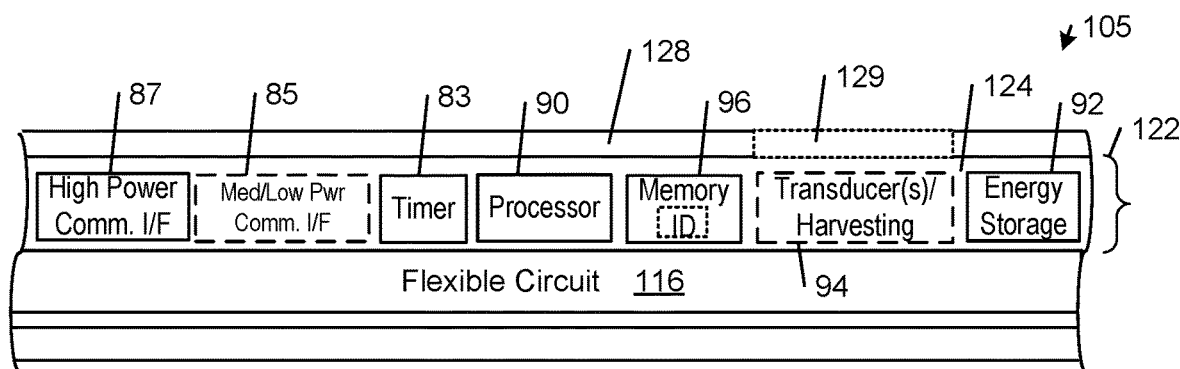

FIG. 5C shows a cross-sectional side view of a portion of an example segment 105 of the flexible adhesive tape platform 100 that includes a respective set of the components of the wireless transducing circuit 106 corresponding to the third tape node type (i.e., black). In this example, the flexible adhesive tape platform segment 105 includes a high power communications interface 87 (e.g., a cellular interface; e.g., GSM/GPRS) and an optional medium and/or low power communications interface 85. The high power communications range provides global coverage to available infrastructure (e.g. the cellular network). In some examples, one or more other components of the flexible adhesive tape platform segment 105 differ, for example, in functionality or capacity (e.g., larger energy source).

FIGS. 5A-5C show examples in which the cover layer 128 of the flexible adhesive tape platform 100 includes one or more interfacial regions 129 positioned over one or more of the transducers 94. In examples, one or more of the interfacial regions 129 have features, properties, compositions, dimensions, and/or characteristics that are designed to improve the operating performance of the platform 100 for specific applications. In some examples, the flexible adhesive tape platform 100 includes multiple interfacial regions 129 over respective transducers 94, which may be the same or different depending on the target applications. Example interfacial regions include an opening, an optically transparent window, and/or a membrane located in the interfacial region 129 of the cover 128 that is positioned over the one or more transducers and/or energy harvesting components 94. Additional details regarding the structure and operation of example interfacial regions 129 are described in U.S. Provisional Patent Application No. 62/680,716, filed Jun. 5, 2018, PCT Patent Application No. PCT/US2018/064919, filed Dec. 11, 2018, U.S. Pat. No. 10,885,420, issued Jan. 4, 2021, U.S. Pat. No. 10,902,310 issued Jan. 25, 2021, and U.S. Provisional Patent Application No. 62/670,712, filed May 11, 2018, all of which are incorporated herein in their entirety.

In some examples, a flexible polymer layer 124 encapsulates the device layer 122 and thereby reduces the risk of damage that may result from the intrusion of contaminants and/or liquids (e.g., water) into the device layer 122. The flexible polymer layer 124 also planarizes the device layer 122. This facilitates optional stacking of additional layers on the device layer 122 and also distributes forces generated in, on, or across the adhesive tape platform segment 102 so as to reduce potentially damaging asymmetric stresses that might be caused by the application of bending, torqueing, pressing, or other forces that may be applied to the flexible adhesive tape platform segment 102 during use. In the illustrated example, a flexible cover 128 is bonded to the planarizing polymer 124 by an adhesive layer (not shown).

The flexible cover 128 and the flexible substrate 110 may have the same or different compositions depending on the intended application. In some examples, one or both of the flexible cover 128 and the flexible substrate 110 include flexible film layers and/or paper substrates, where the film layers may have reflective surfaces or reflective surface coatings. Example compositions for the flexible film layers include polymer films, such as polyester, polyimide, polyethylene terephthalate (PET), and other plastics. The optional adhesive layer on the bottom surface of the flexible cover 128 and the adhesive layers 112, 114 on the top and bottom surfaces of the flexible substrate 110 typically include a pressure-sensitive adhesive (e.g., a silicon-based adhesive). In some examples, the adhesive layers are applied to the flexible cover 128 and the flexible substrate 110 during manufacture of the adhesive tape platform 100 (e.g., during a roll-to-roll or sheet-to-sheet fabrication process). In other examples, the flexible cover 128 may be implemented by a prefabricated single-sided pressure-sensitive adhesive tape and the flexible substrate 110 may be implemented by a prefabricated double-sided pressure-sensitive adhesive tape; both kinds of tape may be readily incorporated into a roll-to-roll or sheet-to-sheet fabrication process. In some examples, the flexible polymer layer 124 is composed of a flexible epoxy (e.g., silicone).

In some examples, the energy storage device 92 is a flexible battery that includes a printed electrochemical cell, which includes a planar arrangement of an anode and a cathode and battery contact pads. In some examples, the flexible battery may include lithium-ion cells or nickel-cadmium electro-chemical cells. The flexible battery typically is formed by a process that includes printing or laminating the electro-chemical cells on a flexible substrate (e.g., a polymer film layer). In some examples, other components may be integrated on the same substrate as the flexible battery. For example, the low power wireless communication interface 81 and/or the processor(s) 90 may be integrated on the flexible battery substrate. In some examples, one or more of such components also (e.g., the flexible antennas and the flexible interconnect circuits) may be printed on the flexible battery substrate.

In some examples, the flexible circuit 116 is formed on a flexible substrate by printing, etching, or laminating circuit patterns on the flexible substrate. In some examples, the flexible circuit 116 is implemented by one or more of a single-sided flex circuit, a double access or back bared flex circuit, a sculpted flex circuit, a double-sided flex circuit, a multi-layer flex circuit, a rigid flex circuit, and a polymer thick film flex circuit. A single-sided flexible circuit has a single conductor layer made of, for example, a metal or conductive (e.g., metal filled) polymer on a flexible dielectric film. A double access or back bared flexible circuit has a single conductor layer but is processed so as to allow access to selected features of the conductor pattern from both sides. A sculpted flex circuit is formed using a multi-step etching process that produces a flex circuit that has finished copper conductors that vary in thickness along their respective lengths. A multilayer flex circuit has three or more layers of conductors, where the layers typically are interconnected using plated through holes. Rigid flex circuits are a hybrid construction of flex circuit consisting of rigid and flexible substrates that are laminated together into a single structure, where the layers typically are electrically interconnected via plated through holes. In polymer thick film (PTF) flex circuits, the circuit conductors are printed onto a polymer base film, where there may be a single conductor layer or multiple conductor layers that are insulated from one another by respective printed insulating layers.

In the example flexible adhesive tape platform segments 102 shown in FIGS. 5A-5C, the flexible circuit 116 is a single access flex circuit that interconnects the components of the adhesive tape platform on a single side of the flexible circuit 116. In other examples, the flexible circuit 116 is a double access flex circuit that includes a front-side conductive pattern that interconnects the low power communications interface 81, the timer circuit 83, the processor 90, the one or more transducers 94 (if present), and the memory 96, and allows through-hole access (not shown) to a back-side conductive pattern that is connected to the flexible battery (not shown). In these examples, the front-side conductive pattern of the flexible circuit 116 connects the communications circuits 82, 86 (e.g., receivers, transmitters, and transceivers) to their respective antennas 84, 88 and to the processor 90, and also connects the processor 90 to the one or more sensors 94 and the memory 96. The backside conductive pattern connects the active electronics (e.g., the processor 90, the communications circuits 82, 86, and the transducers) on the front-side of the flexible circuit 116 to the electrodes of the flexible battery 116 via one or more through holes in the substrate of the flexible circuit 116.

Depending on the target application, the wireless transducing circuits 70 are distributed across the flexible adhesive tape platform 100 according to a specified sampling density, which is the number of wireless transducing circuits 70 for a given unit size (e.g., length or area) of the flexible adhesive tape platform 100. In some examples, a set of multiple flexible adhesive tape platforms 100 are provided that include different respective sampling densities in order to seal different asset sizes with a desired number of wireless transducing circuits 70. In particular, the number of wireless transducing circuits per asset size is given by the product of the sampling density specified for the adhesive tape platform and the respective size of the adhesive tape platform 100 needed to seal the asset. This allows an automated packaging system to select the appropriate type of flexible adhesive tape platform 100 to use for sealing a given asset with the desired redundancy (if any) in the number of wireless transducer circuits 70. In some example applications (e.g., shipping low value goods), only one wireless transducing circuit 70 is used per asset, whereas in other applications (e.g., shipping high value goods) multiple wireless transducing circuits 70 are used per asset. Thus, a flexible adhesive tape platform 100 with a lower sampling density of wireless transducing circuits 70 can be used for the former application, and a flexible adhesive tape platform 100 with a higher sampling density of wireless transducing circuits 70 can be used for the latter application. In some examples, the flexible adhesive tape platforms 100 are color-coded or otherwise marked to indicate the respective sampling densities with which the wireless transducing circuits 70 are distributed across the different types of adhesive tape platforms 100.

Figure 6A:
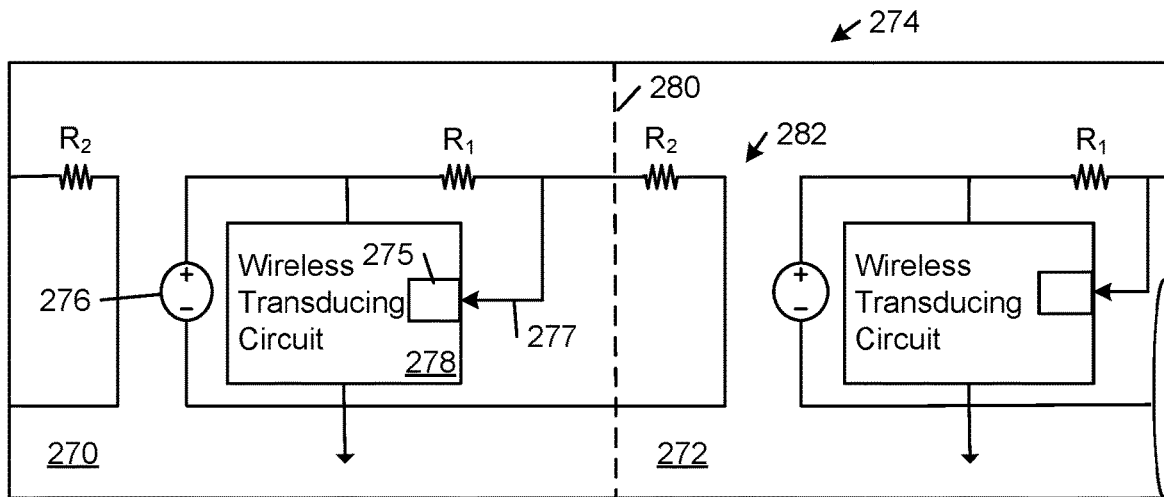
FIGS. 6A-6B are diagrammatic top views of a length of an example adhesive tape platform, according to some embodiments.

Referring to FIG. 6A, in some examples, each of one or more of the segments 270, 272 of a flexible adhesive tape platform 274 includes a respective one-time wake circuit 275 that delivers power from the respective energy source 276 to the respective wireless circuit 278 (e.g., a processor, one or more transducers, and one or more wireless communications circuits) in response to an event. In some of these examples, the wake circuit 275 is configured to transition from an off state to an on state when the voltage on the wake node 277 exceeds a threshold level, at which point the wake circuit transitions to an on state to power-on the segment 270. In the illustrated example, this occurs when the user separates the segment from the adhesive tape platform 274, for example, by cutting across the adhesive tape platform 274 at a designated location (e.g., along a designated cut-line 280). In particular, in its initial, un-cut state, a minimal amount of current flows through the resistors R1 and R2. As a result, the voltage on the wake node 277 remains below the threshold turn-on level. After the user cuts across the adhesive tape platform 274 along the designated cut-line 280, the user creates an open circuit in the loop 282, which pulls the voltage of the wake node above the threshold level and turns on the wake circuit 275. As a result, the voltage across the energy source 276 will appear across the wireless circuit 278 and, thereby, turn on the segment 270. In particular embodiments, the resistance value of resistor R1 is greater than the resistance value of R2. In some examples, the resistance values of resistors R1 and R2 are selected based on the overall design of the adhesive product system (e.g., the target wake voltage level and a target leakage current).

In some examples, each of one or more of the segments of an adhesive tape platform includes a respective sensor and a respective wake circuit that delivers power from the respective energy source to the respective one or more of the respective wireless circuit components 278 in response to an output of the sensor. In some examples, the respective sensor is a strain sensor that produces a wake signal based on a change in strain in the respective segment. In some of these examples, the strain sensor is affixed to a adhesive tape platform and configured to detect the stretching of the tracking adhesive tape platform segment as the segment is being peeled off a roll or a sheet of the adhesive tape platform. In some examples, the respective sensor is a capacitive sensor that produces a wake signal based on a change in capacitance in the respective segment. In some of these examples, the capacitive sensor is affixed to an adhesive tape platform and configured to detect the separation of the tracking adhesive tape platform segment from a roll or a sheet of the adhesive tape platform. In some examples, the respective sensor is a flex sensor that produces a wake signal based on a change in curvature in the respective segment. In some of these examples, the flex sensor is affixed to a adhesive tape platform and configured to detect bending of the tracking adhesive tape platform segment as the segment is being peeled off a roll or a sheet of the adhesive tape platform. In some examples, the respective sensor is a near field communications sensor that produces a wake signal based on a change in inductance in the respective segment.

Figure 6B:
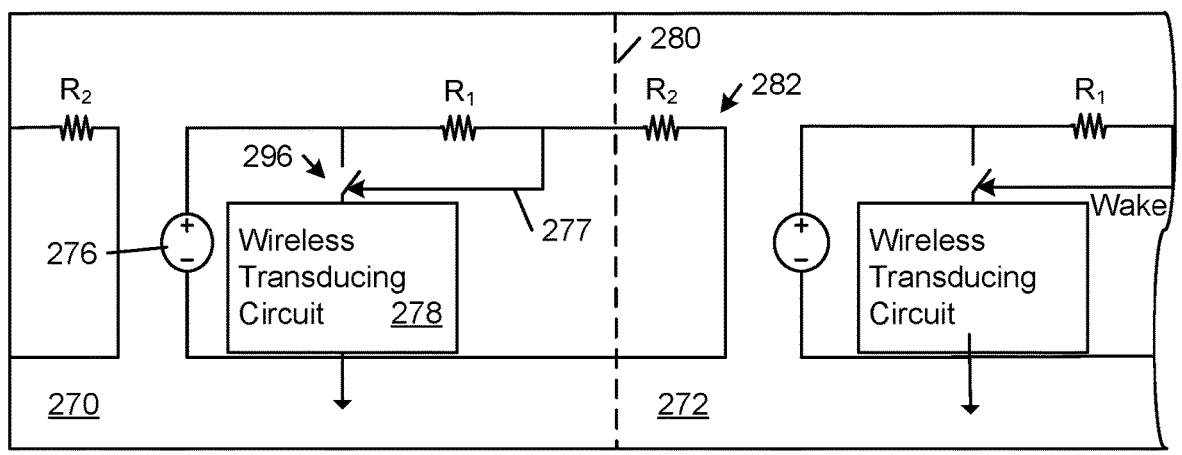

FIG. 6B shows another example of an adhesive tape platform 294 that delivers power from the respective energy source 276 to the respective tracking circuit 278 (e.g., a processor, one or more transducers, and one or more wireless communications circuits) in response to an event. This example is similar in structure and operation as the adhesive tape platform 294 shown in FIG. 6A, except that the wake circuit 275 is implemented by a switch 296 that is configured to transition from an open state to a closed state when the voltage on the switch node 277 exceeds a threshold level. In the initial state of the adhesive tape platform 294, the voltage on the switch node is below the threshold level as a result of the low current level flowing through the resistors R1 and R2. After the user cuts across the adhesive tape platform 294 along the designated cut-line 280, the user creates an open circuit in the loop 282, which pulls up the voltage on the switch node above the threshold level to close the switch 296 and turn on the wireless circuit 278.

Figure 6C:
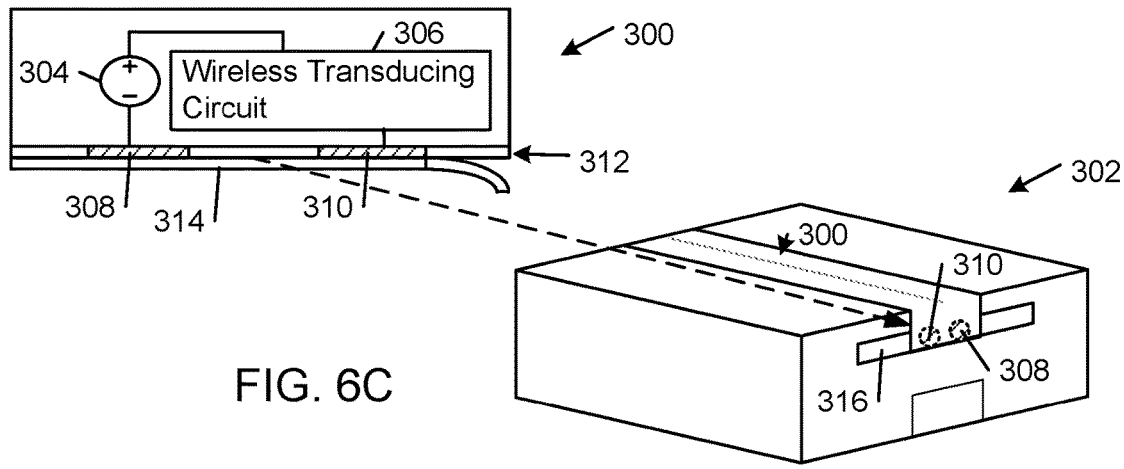
FIG. 6C is a diagrammatic view of a length of an example adhesive tape platform adhered to an asset, according to some embodiments.

FIG. 6C shows a diagrammatic cross-sectional front view of an example adhesive tape platform 300 and a perspective view of an example asset 302. Instead of activating the adhesive tape platform in response to separating a segment of the adhesive tape platform from a roll or a sheet of the adhesive tape platform, this example is configured to supply power from the energy source 302 to turn on the wireless transducing circuit 306 in response to establishing an electrical connection between two power terminals 308, 310 that are integrated into the adhesive tape platform. In particular, each segment of the adhesive tape platform 300 includes a respective set of embedded tracking components, an adhesive layer 312, and an optional backing sheet 314 with a release coating that prevents the segments from adhering strongly to the backing sheet 314. In some examples, the power terminals 308, 310 are composed of an electrically conductive material (e.g., a metal, such as copper) that may be printed or otherwise patterned and/or deposited on the backside of the adhesive tape platform 300. In operation, the adhesive tape platform can be activated by removing the backing sheet 314 and applying the exposed adhesive layer 312 to a surface that includes an electrically conductive region 316. In the illustrated embodiment, the electrically conductive region 316 is disposed on a portion of the asset 302. When the adhesive backside of the adhesive tape platform 300 is adhered to the asset with the exposed terminals 308, 310 aligned and in contact with the electrically conductive region 316 on the asset 302, an electrical connection is created through the electrically conductive region 316 between the exposed terminals 308, 310 that completes the circuit and turns on the wireless transducing circuit 306. In particular embodiments, the power terminals 308, 310 are electrically connected to any respective nodes of the wireless transducing circuit 306 that would result in the activation of the tracking circuit 306 in response to the creation of an electrical connection between the power terminals 308, 310.

In some examples, after a tape node is turned on, it will communicate with the network service to confirm that the user/operator who is associated with the tape node is an authorized user who has authenticated himself or herself to the network service 54. In these examples, if the tape node cannot confirm that the user/operator is an authorized user, the tape node will turn itself off.

Deployment of Tape Nodes

Figure 7:
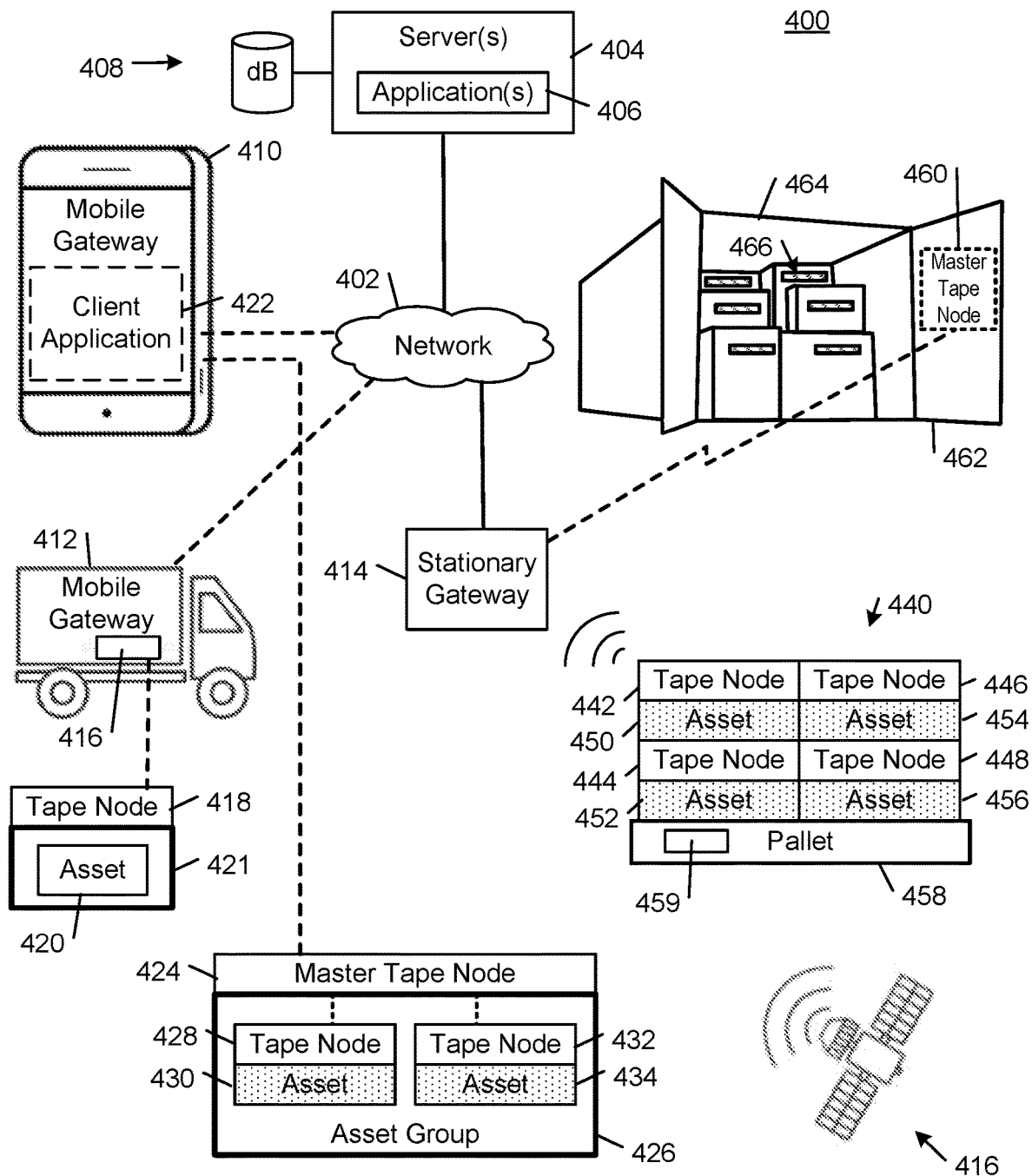
FIG. 7 is a diagrammatic view of an example of a network environment supporting communications with segments of an adhesive tape platform, according to some embodiments.

FIG. 7 shows an example network communications environment 400 (also referred to herein as an "IOT system" 400) that includes a network 402 that supports communications between one or more servers 404 executing one or more applications of a network service 408, mobile gateways 410, 412, a stationary gateway 414, and various types of tape nodes that are associated with various assets (e.g., parcels, equipment, tools, persons, and other things). Each member of the IOT system 400 may be referred to as a node of the IOT system 400, including the tape nodes, other wireless IOT devices, gateways (stationary and mobile), client devices, and servers. In some examples, the network 402 includes one or more network communication systems and technologies, including any one or more of wide area networks, local area networks, public networks (e.g., the internet), private networks (e.g., intranets and extranets), wired networks, and wireless networks. For example, the network 402 includes communications infrastructure equipment, such as a geolocation satellite system 416 (e.g., GPS, GLONASS, and NAVSTAR), cellular communication systems (e.g., GSM/GPRS), Wi-Fi communication systems, RF communication systems (e.g., LoRa), Bluetooth communication systems (e.g., a Bluetooth Low Energy system), Z-wave communication systems, and ZigBee communication systems.

In some examples, the one or more network service applications 406 leverage the above-mentioned communications technologies to create a hierarchical wireless network of tape nodes that improves asset management operations by reducing costs and improving efficiency in a wide range of processes, from asset packaging, asset transporting, asset tracking, asset condition monitoring, asset inventorying, and asset security verification. Communication across the network is secured by a variety of different security mechanisms. In the case of existing infrastructure, a communication link the communication uses the infrastructure security mechanisms. In case of communications among tapes nodes, the communication is secured through a custom security mechanism. In certain cases, tape nodes can also be configured to support block chain to protect the transmitted and stored data.

A set of tape nodes can be configured by the network service 408 to create hierarchical communications network. The hierarchy can be defined in terms of one or more factors, including functionality (e.g., wireless transmission range or power), role (e.g., master tape node vs. peripheral tape node), or cost (e.g., a tape node equipped with a cellular transceiver vs. a peripheral tape node equipped with a Bluetooth LE transceiver). Tape nodes can be assigned to different levels of a hierarchical network according to one or more of the above-mentioned factors. For example, the hierarchy can be defined in terms of communication range or power, where tape nodes with higher power or longer communication range transceivers are arranged at a higher level of the hierarchy than tape nodes with lower power or lower range transceivers. In another example, the hierarchy is defined in terms of role, where, e.g., a master tape node is programmed to bridge communications between a designated group of peripheral tape nodes and a gateway node or server node. The problem of finding an optimal hierarchical structure can be formulated as an optimization problem with battery capacity of nodes, power consumption in various modes of operation, desired latency, external environment, etc. and can be solved using modern optimization methods e.g. neural networks, artificial intelligence, and other machine learning computing systems that take expected and historical data to create an optimal solution and can create algorithms for modifying the system's behavior adaptively in the field.

The tape nodes may be deployed by automated equipment or manually. In this process, a tape node typically is separated from a roll or sheet and adhered to a asset, or other stationary or mobile object (e.g., a structural element of a warehouse, or a vehicle, such as a delivery truck) or stationary object (e.g., a structural element of a building). This process activates the tape node and causes the tape node to communicate with a server 404 of the network service 408. In this process, the tape node may communicate through one or more other tape nodes in the communication hierarchy. In this process, the network server 404 executes the network service application 406 to programmatically configure tape nodes that are deployed in the environment 400. In some examples, there are multiple classes or types of tape nodes, where each tape node class has a different respective set of functionalities and/or capacities.

In some examples, the one or more network service servers 404 communicate over the network 402 with one or more gateways that are configured to send, transmit, forward, or relay messages to the network 402 and activated tape nodes that are associated with respective assets and within communication range. Example gateways include mobile gateways 410, 412 and a stationary gateway 414. In some examples, the mobile gateways 410, 412, and the stationary gateway 414 are able to communicate with the network 402 and with designated sets or groups of tape nodes.

In some examples, the mobile gateway 412 is a vehicle (e.g., a delivery truck or other mobile hub) that includes a wireless communications unit 416 that is configured by the network service 408 to communicate with a designated set of tape nodes, including a peripheral tape node 418 in the form of a label that is adhered to an asset 420 contained within a parcel 421 (e.g., an envelope), and is further configured to communicate with the network service 408 over the network 402. In some examples, the peripheral tape node 418 includes a lower power wireless communications interface of the type used in, e.g., tape node 102 (shown in FIG. 5A), and the wireless communications unit 416 is implemented by a tape node (e.g., one of tape node 103 or tape node 105, respectively shown in FIGS. 5B and 5C) that includes a lower power communications interface for communicating with tape nodes within range of the mobile gateway 412 and a higher power communications interface for communicating with the network 402. In this way, the tape nodes 418 and 416 create a hierarchical wireless network of nodes for transmitting, forwarding, bridging, relaying, or otherwise communicating wireless messages to, between, or on behalf of the peripheral tape node 418 and the network service 408 in a power-efficient and cost-effective way.

In some examples, the mobile gateway 410 is a mobile phone that is operated by a human operator and executes a client application 422 that is configured by the network service 408 to communicate with a designated set of tape nodes, including a master tape node 424 that is adhered to a parcel 426 (e.g., a box), and is further configured to communicate with the network service 408 over the network 402. In the illustrated example, the parcel 426 contains a first parcel labeled or sealed by a tape node 428 and containing a first asset 430, and a second parcel labeled or sealed by a tape node 432 and containing a second asset 434. As explained in detail below, the master tape node 424 communicates with each of the peripheral tape nodes 428, 432 and communicates with the mobile gateway 408 in accordance with a hierarchical wireless network of tape nodes. In some examples, each of the peripheral tape nodes 428, 432 includes a lower power wireless communications interface of the type used in, e.g., tape node 102 (shown in FIG. 5A), and the master tape node 424 is implemented by a tape node (e.g., tape node 103, shown in FIG. 5B) that includes a lower power communications interface for communicating with the peripheral tape nodes 428, 432 contained within the parcel 426, and a higher power communications interface for communicating with the mobile gateway 410. The master tape node 424 is operable to relay wireless communications between the tape nodes 428, 432 contained within the parcel 426 and the mobile gateway 410, and the mobile gateway 410 is operable to relay wireless communications between the master tape node 424 and the network service 408 over the wireless network 402. In this way, the master tape node 424 and the peripheral tape nodes 428 and 432 create a hierarchical wireless network of nodes for transmitting, forwarding, relaying, or otherwise communicating wireless messages to, between, or on behalf of the peripheral tape nodes 428, 432 and the network service 408 in a power-efficient and cost-effective way.

In some examples, the stationary gateway 414 is implemented by a server executing a server application that is configured by the network service 408 to communicate with a designated set 440 of tape nodes 442, 444, 446, 448 that are adhered to respective parcels containing respective assets 450, 452, 454, 456 on a pallet 458. In other examples, the stationary gateway 414 is implemented by a tape node (e.g., one of tape node 103 or tape node 105, respectively shown in FIGS. 5B and 5C) that is adhered to, for example, a wall, column or other infrastructure component of the environment 400, and includes a lower power communications interface for communicating with tape nodes within range of the stationary gateway 414 and a higher power communications interface for communicating with the network 402. In one embodiment, each of the tape nodes 442-448 is a peripheral tape node and is configured by the network service 408 to communicate individually with the stationary gateway 414, which relays communications from the tape nodes 442-448 to the network service 408 through the stationary gateway 414 and over the communications network 402. In another embodiment, one of the tape nodes 442-448 at a time is configured as a master tape node that transmits, forwards, relays, or otherwise communicate wireless messages to, between, or on behalf of the other tape nodes on the pallet 458. In this embodiment, the master tape node may be determined by the tape nodes 442-448 or designated by the network service 408. In some examples, the tape node with the longest range or highest remaining power level is determined to be the master tape node. In some examples, when the power level of the current master tape node drops below a certain level (e.g., a fixed power threshold level or a threshold level relative to the power levels of one or more of the other tape nodes), another one of the tape nodes assumes the role of the master tape node. In some examples, a master tape node 459 is adhered to the pallet 458 and is configured to perform the role of a master node for the tape nodes 442-448. In these ways, the tape nodes 442-448, 458 are configurable to create different hierarchical wireless networks of nodes for transmitting, forwarding, relaying, bridging, or otherwise communicating wireless messages with the network service 408 through the stationary gateway 414 and over the network 402 in a power-efficient and cost-effective way.

In the illustrated example, the stationary gateway 414 also is configured by the network service 408 to communicate with a designated set of tape nodes, including a master tape node 460 that is adhered to the inside of a door 462 of a shipping container 464, and is further configured to communicate with the network service 408 over the network 402. In the illustrated example, the shipping container 464 contains a number of parcels labeled or sealed by respective peripheral tape nodes 466 and containing respective assets. The master tape node 416 communicates with each of the peripheral tape nodes 466 and communicates with the stationary gateway 415 in accordance with a hierarchical wireless network of tape nodes. In some examples, each of the peripheral tape nodes 466 includes a lower power wireless communications interface of the type used in, e.g., tape node 102 (shown in FIG. 5A), and the master tape node 460 is implemented by a tape node (e.g., tape node 103, shown in FIG. 5B) that includes a lower power communications interface for communicating with the peripheral tape nodes 466 contained within the shipping container 464, and a higher power communications interface for communicating with the stationary gateway 414.

In some examples, when the doors of the shipping container 464 are closed, the master tape node 460 is operable to communicate wirelessly with the peripheral tape nodes 466 contained within the shipping container 464. In an example, the master tape node 460 is configured to collect sensor data from the peripheral tape nodes and, in some embodiments, process the collected data to generate, for example, one or more histograms from the collected data. When the doors of the shipping container 464 are open, the master tape node 460 is programmed to detect the door opening (e.g., with an accelerometer component of the master tape node 460) and, in addition to reporting the door opening event to the network service 408, the master tape node 460 is further programmed to transmit the collected data and/or the processed data in one or more wireless messages to the stationary gateway 414. The stationary gateway 414, in turn, is operable to transmit the wireless messages received from the master tape node 460 to the network service 408 over the wireless network 402. Alternatively, in some examples, the stationary gateway 414 also is operable to perform operations on the data received from the master tape node 460 with the same type of data produced by the master node 459 based on sensor data collected from the tape nodes 442-448. In this way, the master tape node 460 and the peripheral tape nodes 466 create a hierarchical wireless network of nodes for transmitting, forwarding, relaying, or otherwise communicating wireless messages to, between, or on behalf of the peripheral tape nodes 466 and the network service 408 in a power-efficient and cost-effective way.

In an example of the embodiment shown in FIG. 7, there are three classes of tape nodes: a short range tape node, a medium range tape node, and a long range tape node, as respectively shown in FIGS. 5A-5C. The short range tape nodes typically are adhered directly to parcels containing assets. In the illustrated example, the tape nodes 418, 428, 432, 442-448, 466 are short range tape nodes. The short range tape nodes typically communicate with a low power wireless communication protocol (e.g., Bluetooth LE, Zigbee, or Z-wave). The medium range tape nodes typically are adhered to objects (e.g., a box 426 and a shipping container 460) that are associated with multiple parcels that are separated from the medium range tape nodes by a barrier or a large distance. In the illustrated example, the tape nodes 424 and 460 are medium range tape nodes. The medium range tape nodes typically communicate with a medium power wireless communication protocol (e.g., LoRa or Wi-Fi). The long-range tape nodes typically are adhered to mobile or stationary infrastructure of the wireless communication environment 400. In the illustrated example, the mobile gateway tape node 412 and the stationary gateway tape node 414 are long range tape nodes. The long range tape nodes typically communicate with other nodes using a high power wireless communication protocol (e.g., a cellular data communication protocol). In some examples, the mobile gateway tape node 436 is adhered to a mobile vehicle (e.g., a truck). In these examples, the mobile gateway 412 may be moved to different locations in the environment 400 to assist in connecting other tape nodes to the server 404. In some examples, the stationary gateway tape node 414 may be attached to a stationary structure (e.g., a wall) in the environment 400 with a known geographic location. In these examples, other tape nodes in the environment can determine their geographic location by querying the gateway tape node 414.

Wireless Communications Network

Figure 8:
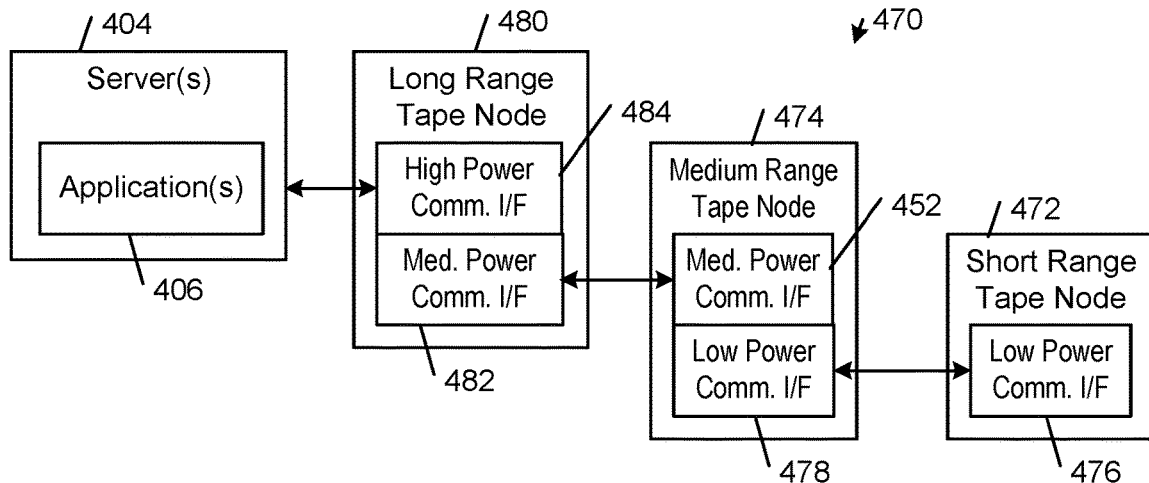
FIG. 8 is a diagrammatic view of a hierarchical communications network, according to some embodiments.

FIG. 8 shows an example hierarchical wireless communications network of tape nodes 470. In this example, the short range tape node 472 and the medium range tape node 474 communicate with one another over their respective low power wireless communication interfaces 476, 478. The medium range tape node 474 and the long range tape node 480 communicate with one another over their respective medium power wireless communication interfaces 478, 482. The long range tape node 480 and the network server 404 communicate with one another over the high power wireless communication interface 484. In some examples, the low power communication interfaces 476, 478 establish wireless communications with one another in accordance with the Bluetooth LE protocol, the medium power communication interfaces 452, 482 establish wireless communications with one another in accordance with the LoRa communications protocol, and the high power communication interface 484 establishes wireless communications with the server 404 in accordance with a cellular communications protocol.

In some examples, the different types of tape nodes are deployed at different levels in the communications hierarchy according to their respective communications ranges, with the long range tape nodes generally at the top of the hierarchy, the medium range tape nodes generally in the middle of the hierarchy, and the short range tape nodes generally at the bottom of the hierarchy. In some examples, the different types of tape nodes are implemented with different feature sets that are associated with component costs and operational costs that vary according to their respective levels in the hierarchy. This allows system administrators flexibility to optimize the deployment of the tape nodes to achieve various objectives, including cost minimization, asset tracking, asset localization, and power conservation.

In some examples, a server 404 of the network service 408 designates a tape node at a higher level in a hierarchical communications network as a master node of a designated set of tape nodes at a lower level in the hierarchical communications network. For example, the designated master tape node may be adhered to a parcel (e.g., a box, pallet, or shipping container) that contains one or more tape nodes that are adhered to one or more assets containing respective assets. In order to conserve power, the tape nodes typically communicate according to a schedule promulgated by the server 404 of the network service 408. The schedule usually dictates all aspects of the communication, including the times when particular tape nodes should communicate, the mode of communication, and the contents of the communication. In one example, the server 404 transmits programmatic Global Scheduling Description Language (GSDL) code to the master tape node and each of the lower-level tape nodes in the designated set. In this example, execution of the GSDL code causes each of the tape nodes in the designated set to connect to the master tape node at a different respective time that is specified in the GSDL code, and to communicate a respective set of one or more data packets of one or more specified types of information over the respective connection. In some examples, the master tape node simply forwards the data packets to the server network node 404, either directly or indirectly through a gateway tape node (e.g., the long range tape node 416 adhered to the mobile vehicle 412 or the long range tape node 414 adhered to an infrastructure component of the environment 400). In other examples, the master tape node processes the information contained in the received data packets and transmits the processed information to the server network node 404.

Figure 9:
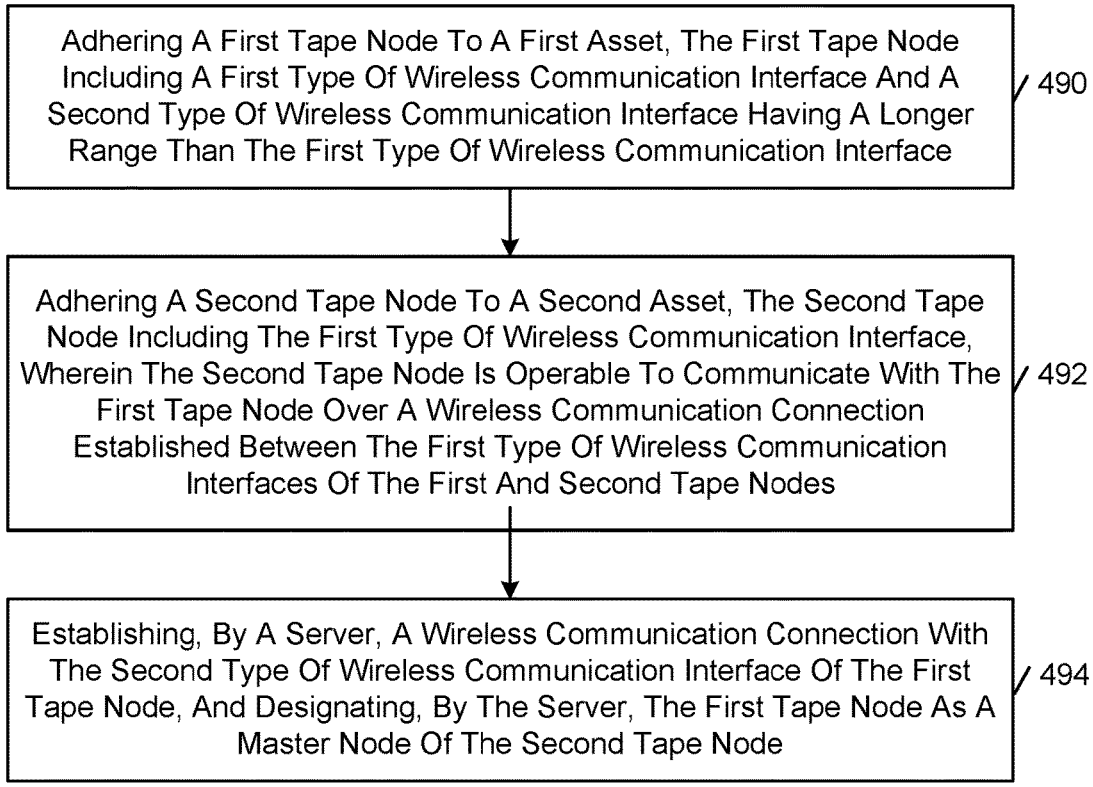
FIG. 9 is a flow diagram of a method of creating a hierarchical communications network, according to some embodiments.

FIG. 9 shows an example method of creating a hierarchical communications network. In accordance with this method, a first tape node is adhered to a first asset in a set of associated assets, the first tape node including a first type of wireless communication interface and a second type of wireless communication interface having a longer range than the first type of wireless communication interface (FIG. 9, block 490). A second tape node is adhered to a second asset in the set, the second tape node including the first type of wireless communication interface, wherein the second tape node is operable to communicate with the first tape node over a wireless communication connection established between the first type of wireless communication interfaces of the first and second tape nodes (FIG. 9, block 492). An application executing on a computer system (e.g., a server 404 of a network service 408) establishes a wireless communication connection with the second type of wireless communication interface of the first tape node, and the application transmits programmatic code executable by the first tape node to function as a master tape node with respect to the second tape node (FIG. 9, block 494).

In other embodiments, the second tape node is assigned the role of the master node of the first tape node.

Distributed Agent Operating System

As used herein, the term "node" refers to both a tape node and a non-tape node (i.e., a node or wireless device that is not an adhesive tape platform) unless the node is explicitly designated as a "tape node" or a "non-tape node." In some embodiments, a non-tape node may have the same or similar communication, sensing, processing and other functionalities and capabilities as the tape nodes described herein, except without being integrated into a tape platform. In some embodiments, non-tape nodes can interact seamlessly with tape nodes. Each node may be assigned a respective unique identifier, according to some embodiments.

The following disclosure describes a distributed software operating system that is implemented by distributed hardware nodes executing intelligent agent software to perform various tasks or algorithms. In some embodiments, the operating system distributes functionalities (e.g., performing analytics on data or statistics collected or generated by nodes) geographically across multiple intelligent agents that are bound to items (e.g., parcels, containers, packages, boxes, pallets, a loading dock, a door, a light switch, a vehicle such as a delivery truck, a shipping facility, a port, a hub, etc.). In addition, the operating system dynamically allocates the hierarchical roles (e.g., master and slave roles) that nodes perform over time in order to improve system performance, such as optimizing battery life across nodes, improving responsiveness, and achieving overall objectives. In some embodiments, optimization is achieved using a simulation environment for optimizing key performance indicators (PKIs).

In some embodiments, the nodes are programmed to operate individually or collectively as autonomous intelligent agents. In some embodiments, nodes are configured to communicate and coordinate actions and respond to events. In some embodiments, a node is characterized by its identity, its mission, and the services that it can provide to other nodes. A node's identity is defined by its capabilities (e.g., battery life, sensing capabilities, and communications interfaces). A node's mission (or objective) is defined by the respective program code, instructions, or directives it receives from another node (e.g., a server or a master node) and the actions or tasks that it performs in accordance with that program code, instructions, or directives (e.g., sense temperature every hour and send temperature data to a master node to upload to a server). A node's services define the functions or tasks that it is permitted to perform for other nodes (e.g., retrieve temperature data from a peripheral node and send the received temperature data to the server). At least for certain tasks, once programmed and configured with their identities, missions, and services, nodes can communicate with one another and request services from and provide services to one another independently of the server.

Thus, in accordance with the runtime operating system every agent knows its objectives (programmed). Every agent knows which capabilities/resources it needs to fulfill objective. Every agent communicates with every other node in proximity to see if it can offer the capability. Examples include communicate data to the server, authorize going to lower power level, temperature reading, send an alert to local hub, send location data, triangulate location, any boxes in same group that already completed group objectives.

Nodes can be associated with items. Examples of an item includes, but are not limited to for example, a package, a box, pallet, a container, a truck or other conveyance, infrastructure such as a door, a conveyor belt, a light switch, a road, or any other thing that can be tracked, monitored, sensed, etc. or that can transmit data concerning its state or environment. In some examples, a server or a master node may associate the unique node identifiers with the items.

Communication paths between tape and/or non-tape nodes may be represented by a graph of edges between the corresponding assets (e.g., a storage unit, truck, or hub). In some embodiments, each node in the graph has a unique identifier. A set of connected edges between nodes is represented by a sequence of the node identifiers that defines a communication path between a set of nodes.

Figure 10A:
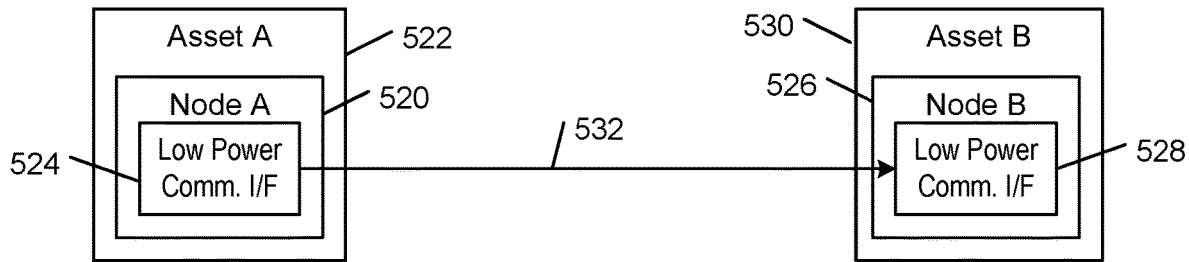
FIGS. 10A-10E are diagrammatic views of exemplary use cases for a distributed agent operating system, according to some embodiments.

Referring to FIG. 10A, a node 520 (Node A) is associated with an asset 522 (Asset A). In some embodiments, the node 520 may be implemented as a tape node that is used to seal the asset 522 or it may be implemented as a label node that is used to label the asset 522; alternatively, the node 520 may be implemented as a non-tape node that is inserted within the asset 522 or embedded in or otherwise attached to the interior or exterior of the asset 522. In the illustrated embodiment, the node 520 includes a low power communications interface 524 (e.g., a Bluetooth Low Energy communications interface). Another node 526 (Node B), which is associated with another asset 530 (Asset B), is similarly equipped with a compatible low power communications interface 528 (e.g., a Bluetooth Low Energy communications interface).

In an example scenario, in accordance with the programmatic code stored in its memory, node 526 (Node B) requires a connection to node 520 (Node A) to perform a task that involves checking the battery life of Node A. Initially, Node B is unconnected to any other nodes. In accordance with the programmatic code stored in its memory, Node B periodically broadcasts advertising packets into the surrounding area. When the other node 520 (Node A) is within range of Node B and is operating in a listening mode, Node A will extract the address of Node B and potentially other information (e.g., security information) from an advertising packet. If, according to its programmatic code, Node A determines that it is authorized to connect to Node B, Node A will attempt to pair with Node B. In this process, Node A and Node B determine each other's identities, capabilities, and services. For example, after successfully establishing a communication path 532 with Node A (e.g., a Bluetooth Low Energy formatted communication path), Node B determines Node A's identity information (e.g., master node), Node A's capabilities include reporting its current battery life, and Node A's services include transmitting its current battery life to other nodes. In response to a request from Node B, Node A transmits an indication of its current battery life to Node B.

Figure 10B:
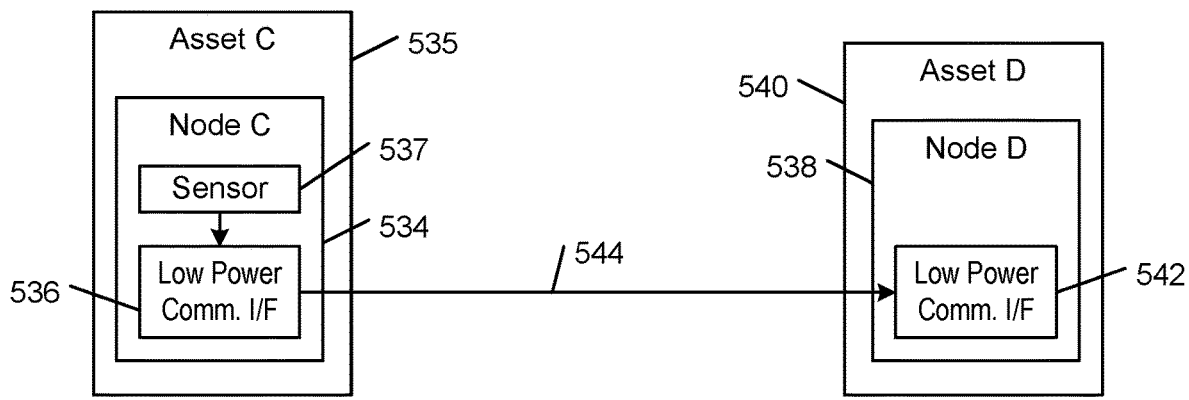

Referring to FIG. 10B, a node 534 (Node C) is associated with an asset 535 (Asset C). In the illustrated embodiment, the Node C includes a low power communications interface 536 (e.g., a Bluetooth Low Energy communications interface), and a sensor 537 (e.g., a temperature sensor). Another node 538 (Node D), which is associated with another asset 540 (Asset D), is similarly equipped with a compatible low power communications interface 542 (e.g., a Bluetooth Low Energy communications interface).

In an example scenario, in accordance with the programmatic code stored in its memory, Node D requires a connection to Node C to perform a task that involves checking the temperature in the vicinity of Node C. Initially, Node D is unconnected to any other nodes. In accordance with the programmatic code stored in its memory, Node D periodically broadcasts advertising packets in the surrounding area. When Node C is within range of Node D and is operating in a listening mode, Node C will extract the address of Node D and potentially other information (e.g., security information) from the advertising packet. If, according to its programmatic code, Node C determines that it is authorized to connect to Node D, Node C will attempt to pair with Node D. In this process, Node C and Node D determine each other's identities, capabilities, and services. For example, after successfully establishing a communication path 544 with Node C (e.g., a Bluetooth Low Energy formatted communication path), Node D determines Node C's identity information (e.g., a peripheral node), Node C's capabilities include retrieving temperature data, and Node C's services include transmitting temperature data to other nodes. In response to a request from Node D, Node C transmits its measured and/or locally processed temperature data to Node D.

Figure 10C:
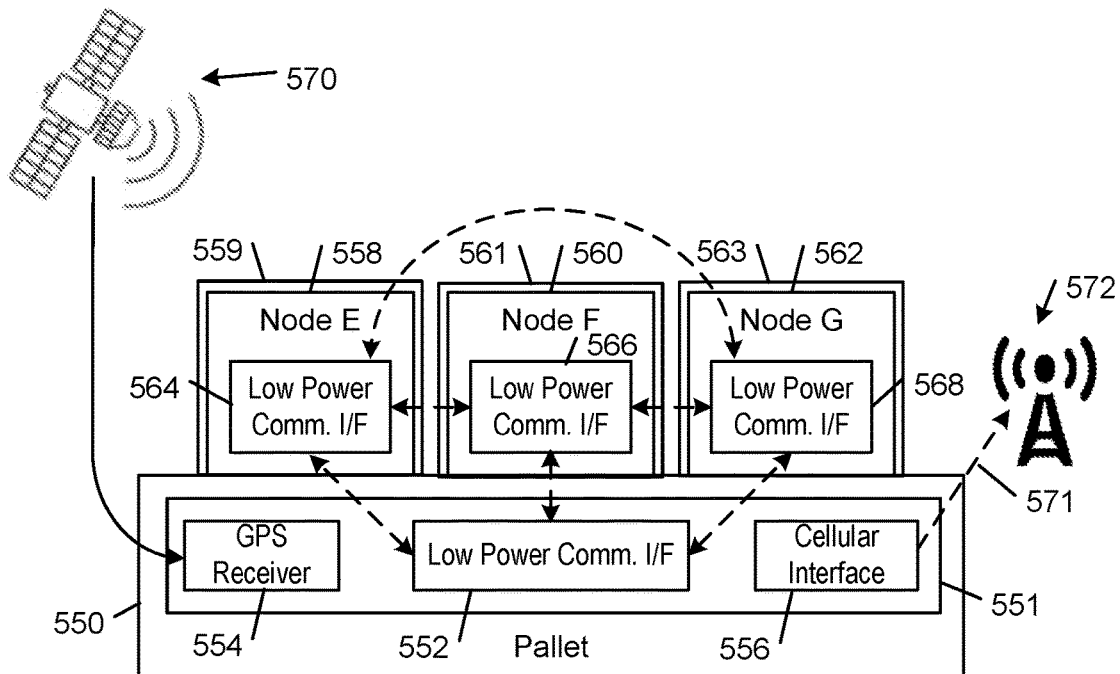

Referring to FIG. 10C, a pallet 550 is associated with a master node 551 that includes a low power communications interface 552, a GPS receiver 554, and a cellular communications interface 556. In some embodiments, the master node 551 may be implemented as a tape node or a label node that is adhered to the pallet 550. In other embodiments, the master node 551 may be implemented as a non-tape node that is inserted within the body of the pallet 550 or embedded in or otherwise attached to the interior or exterior of the pallet 550.

The pallet 550 provides a structure for grouping and containing assets 559, 561, 563 each of which is associated with a respective peripheral node 558, 560, 562 (Node E, Node F, and Node G). Each of the peripheral nodes 558, 560, 562 includes a respective low power communications interface 564, 566, 568 (e.g., Bluetooth Low Energy communications interface). In the illustrated embodiment, each of the nodes E, F, G and the master node 551 are connected to each of the other nodes over a respective low power communications path (shown by dashed lines).

In some embodiments, the assets 559, 561, 563 are grouped together because they are related. For example, the assets 559, 561, 563 may share the same shipping itinerary or a portion thereof. In an example scenario, the master pallet node 550 scans for advertising packets that are broadcasted from the peripheral nodes 558, 560, 562. In some examples, the peripheral nodes broadcast advertising packets during respective scheduled broadcast intervals. The master node 551 can determine the presence of the assets 559, 561, 563 in the vicinity of the pallet 550 based on receipt of one or more advertising packets from each of the nodes E, F, and G. In some embodiments, in response to receipt of advertising packets broadcasted by the peripheral nodes 558, 560, 562, the master node 551 transmits respective requests to the server to associate the master node 551 and the respective peripheral nodes 558, 560, 562. In some examples, the master tape node requests authorization from the server to associate the master tape node and the peripheral tape nodes. If the corresponding assets 559, 561, 563 are intended to be grouped together (e.g., they share the same itinerary or certain segments of the same itinerary), the server authorizes the master node 551 to associate the peripheral nodes 558, 560, 562 with one another as a grouped set of assets. In some embodiments, the server registers the master node and peripheral tape node identifiers with a group identifier. The server also may associate each node ID with a respective physical label ID that is affixed to the respective asset.

In some embodiments, after an initial set of assets is assigned to a multi-asset group, the master node 551 may identify another asset arrives in the vicinity of the multi-asset group. The master node may request authorization from the server to associate the other asset with the existing multi-asset group. If the server determines that the other asset is intended to ship with the multi-asset group, the server instructs the master node to merge one or more other assets with currently grouped set of assets. After all assets are grouped together, the server authorizes the multi-asset group to ship. In some embodiments, this process may involve releasing the multi-asset group from a containment area (e.g., customs holding area) in a shipment facility.

In some embodiments, the peripheral nodes 558, 560, 562 include environmental sensors for obtaining information regarding environmental conditions in the vicinity of the associated assets 559, 561, 563. Examples of such environmental sensors include temperature sensors, humidity sensors, acceleration sensors, vibration sensors, shock sensors, pressure sensors, altitude sensors, light sensors, and orientation sensors.

In the illustrated embodiment, the master node 551 can determine its own location based on geolocation data transmitted by a satellite-based radio navigation system 570 (e.g., GPS, GLONASS, and NAVSTAR) and received by the GPS receiver 554 component of the master node 551. In an alternative embodiment, the location of the master pallet node 551 can be determined using cellular based navigation techniques that use mobile communication technologies (e.g., GSM, GPRS, CDMA, etc.) to implement one or more cell-based localization techniques. After the master node 551 has ascertained its location, the distance of each of the assets 559, 561, 563 from the master node 551 can be estimated based on the average signal strength of the advertising packets that the master node 551 receives from the respective peripheral node. The master node 551 can then transmit its own location and the locations of the asset nodes E, F, and G to a server over a cellular interface connection with a cell tower 572. Other methods of determining the distance of each of the assets 559, 561, 563 from the master node 551, such as Received Signal-Strength Index (RSSI) based indoor localization techniques, also may be used.

In some embodiments, after determining its own location and the locations of the peripheral nodes, the master node 551 reports the location data and the collected and optionally processed (e.g., either by the peripheral nodes peripheral nodes 558, 560, 562 or the master node 551) sensor data to a server over a cellular communication path 571 on a cellular network 572.

In some examples, nodes are able to autonomously detect logistics execution errors if assets that suppose to travel together no longer travel together, and raise an alert. For example, a node (e.g., the master node 551 or one of the peripheral nodes 558, 560, 562) alerts the server when the node determines that a particular asset 559 is being or has already been improperly separated from the group of assets. The node may determine that there has been an improper separation of the particular asset 559 in a variety of ways. For example, the associated node 558 that is bound to the particular asset 559 may include an accelerometer that generates a signal in response to movement of the asset from the pallet. In accordance with its intelligent agent program code, the associated node 558 determines that the master node 551 has not disassociated the particular asset 559 from the group and therefore broadcasts advertising packets to the master node, which causes the master node 551 to monitor the average signal strength of the advertising packets and, if the master node 551 determines that the signal strength is decreasing over time, the master node 551 will issue an alert either locally (e.g., through a speaker component of the master node 551) or to the server.

Figure 10D:
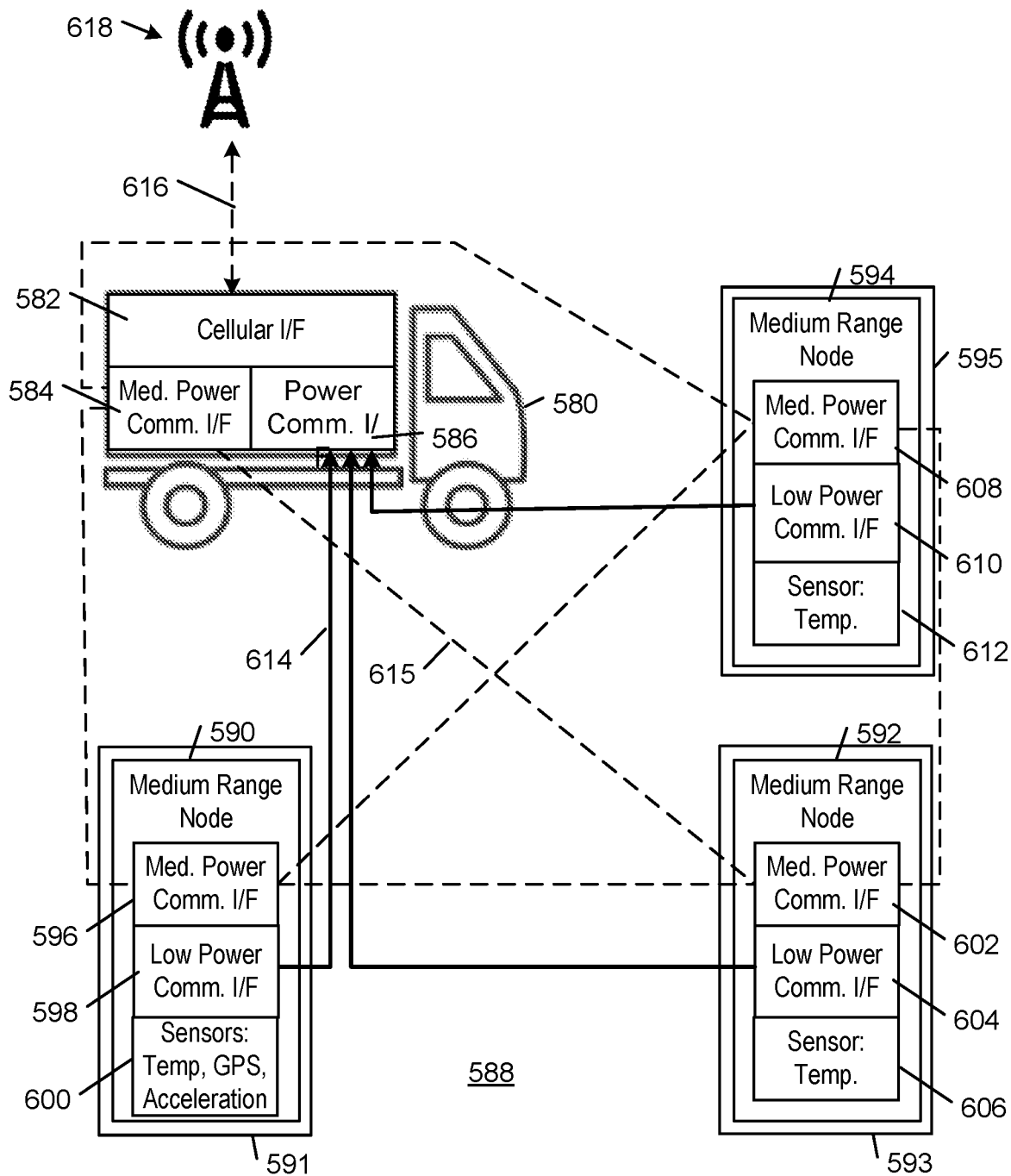

Referring to FIG. 10D, a truck 580 is configured as a mobile node or mobile hub that includes a cellular communications interface 582, a medium power communications interface 584, and a low power communications interface 586. The communications interfaces 580-586 may be implemented on one or more tape and non-tape nodes. In an illustrative scenario, the truck 580 visits a storage facility, such as a warehouse 588, to wirelessly obtain temperature data generated by temperature sensors in the medium range nodes 590, 592, 594. The warehouse 588 contains nodes 590, 592, and 594 that are associated with respective assets 591, 593, 595. In the illustrated embodiment, each node 590-594 is a medium range node that includes a respective medium power communications interface 596, 602, 608, a respective low power communications interface 598, 604, 610 and one or more respective sensors 600, 606, 612. In the illustrated embodiment, each of the asset nodes 590, 592, 594 and the truck 580 is connected to each of the other ones of the asset nodes through a respective medium power communications path (shown by dashed lines). In some embodiments, the medium power communications paths are LoRa formatted communication paths.

In some embodiments, the communications interfaces 584 and 586 (e.g., a LoRa communications interface and a Bluetooth Low Energy communications interface) on the node on the truck 580 is programmed to broadcast advertisement packets to establish connections with other network nodes within range of the truck node. A warehouse 588 includes medium range nodes 590, 592, 594 that are associated with respective containers 591, 593, 595 (e.g., assets, boxes, pallets, and the like). When the truck node's low power interface 586 is within range of any of the medium range nodes 590, 592, 594 and one or more of the medium range nodes is operating in a listening mode, the medium range node will extract the address of truck node and potentially other information (e.g., security information) from the advertising packet. If, according to its programmatic code, the truck node determines that it is authorized to connect to one of the medium range nodes 590, 592, 594, the truck node will attempt to pair with the medium range node. In this process, the truck node and the medium range node determine each other's identities, capabilities, and services. For example, after successfully establishing a communication path with the truck node (e.g., a Bluetooth Low Energy formatted communication path 614 or a LoRa formatted communication path 617), the truck node determines the identity information for the medium range node 590 (e.g., a peripheral node), the medium range node's capabilities include retrieving temperature data, and the medium range node's services include transmitting temperature data to other nodes. Depending of the size of the warehouse 588, the truck 580 initially may communicate with the nodes 590, 592, 594 using a low power communications interface (e.g., Bluetooth Low Energy interface). If any of the anticipated nodes fails to respond to repeated broadcasts of advertising packets by the truck 580, the truck 580 will try to communicate with the non-responsive nodes using a medium power communications interface (e.g., LoRa interface). In response to a request from the truck node 584, the medium range node 590 transmits an indication of its measured temperature data to the truck node. The truck node repeats the process for each of the other medium range nodes 592, 594 that generate temperature measurement data in the warehouse 588. The truck node reports the collected (and optionally processed, either by the medium range nodes 590, 592, 594 or the truck node) temperature data to a server over a cellular communication path 616 with a cellular network 618.

Figure 10E:
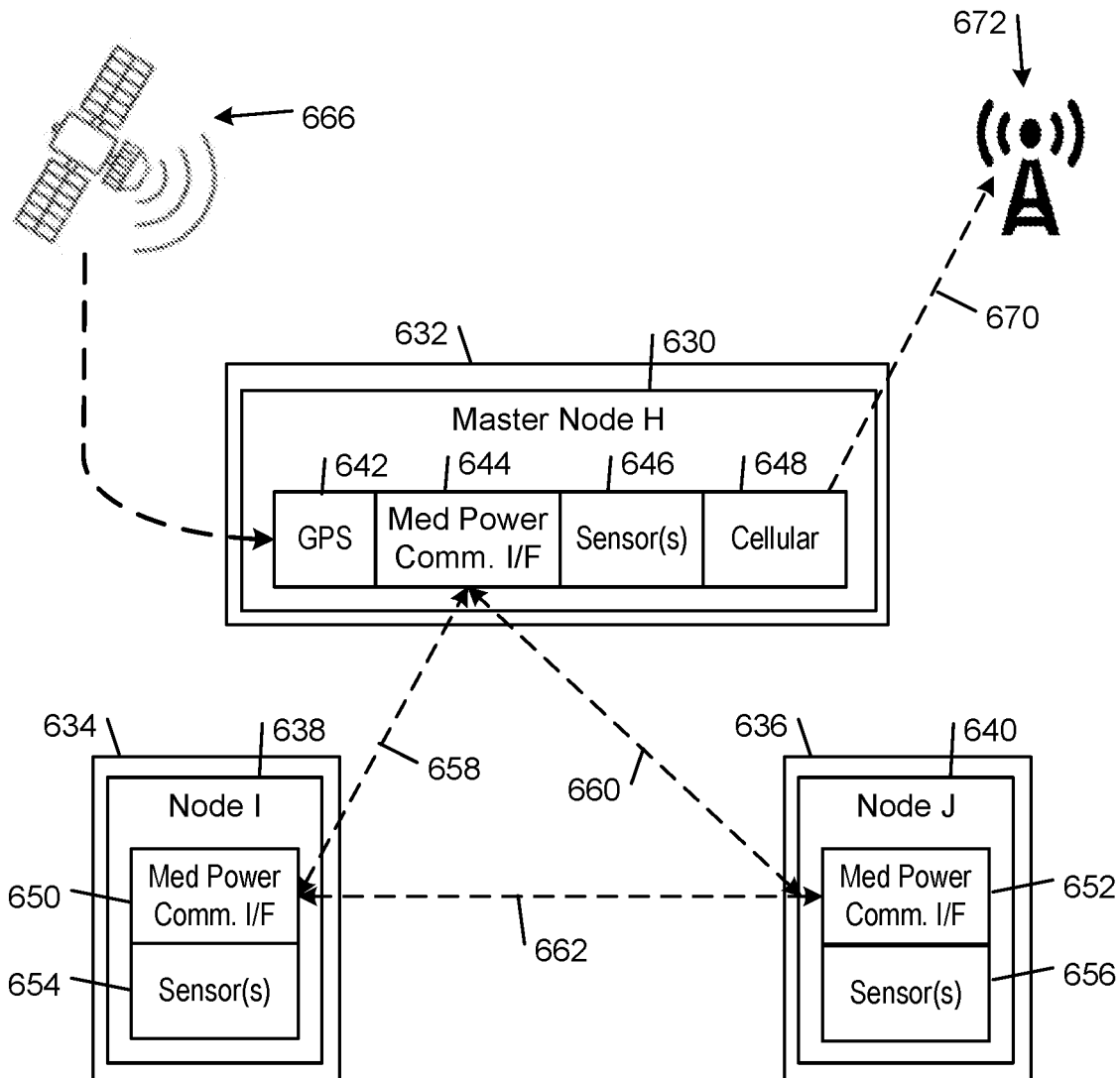

Referring to FIG. 10E, a master node 630 is associated with an item 632 (e.g., an asset) and grouped together with other items 634, 636 (e.g., assets) that are associated with respective peripheral nodes 638, 640. The master node 630 includes a GPS receiver 642, a medium power communications interface 644, one or more sensors 646, and a cellular communications interface 648. Each of the peripheral nodes 638, 640 includes a respective medium power communications interface 650, 652 and one or more respective sensors 654, 656. In the illustrated embodiment, the peripheral and master nodes are connected to one another other over respective pairwise communications paths (shown by dashed lines). In some embodiments, the nodes 630 638, 640 communicate through respective LoRa communications interfaces over LoRa formatted communications paths 658, 660, 662.

In the illustrated embodiment, the master and peripheral nodes 638, 638, 640 include environmental sensors for obtaining information regarding environmental conditions in the vicinity of the associated assets 632, 634, 636. Examples of such environmental sensors include temperature sensors, humidity sensors, acceleration sensors, vibration sensors, shock sensors, pressure sensors, altitude sensors, light sensors, and orientation sensors.

In accordance with the programmatic code stored in its memory, the master node 630 periodically broadcasts advertising packets in the surrounding area. When the peripheral nodes 638, 640 are within range of master node 630, and are operating in a listening mode, the peripheral nodes 638, 640 will extract the address of master node 630 and potentially other information (e.g., security information) from the advertising packets. If, according to their respective programmatic code, the peripheral nodes 638, 640 determine that hey are authorized to connect to the master node 630, the peripheral nodes 638, 640 will attempt to pair with the master node 630. In this process, the peripheral nodes 638, 640 and the master node and the peripheral nodes determine each other's identities, capabilities, and services. For example, after successfully establishing a respective communication path 658, 660 with each of the peripheral nodes 638, 640 (e.g., a LoRa formatted communication path), the master node 630 determines certain information about the peripheral nodes 638, 640, such as their identity information (e.g., peripheral nodes), their capabilities (e.g., measuring temperature data), and their services include transmitting temperature data to other nodes.

After establishing LoRa formatted communications paths 658, 660 with the peripheral nodes 638, 640, the master node 630 transmits requests for the peripheral nodes 638, 640 to transmit their measured and/or locally processed temperature data to the master node 630.

In the illustrated embodiment, the master node 630 can determine its own location based on geolocation data transmitted by a satellite-based radio navigation system 666 (e.g., GPS, GLONASS, and NAVSTAR) and received by the GPS receiver 642 component of the master node 630. In an alternative embodiment, the location of the master node 630 can be determined using cellular based navigation techniques that use mobile communication technologies (e.g., GSM, GPRS, CDMA, etc.) to implement one or more cell-based localization techniques. After the master node 630 has ascertained its location, the distance of each of the assets 634, 636 from the master node 630 can be estimated based on the average signal strength of the advertising packets that the master node 630 receives from the respective peripheral node. The master node 630 can then transmit its own location and the locations of the asset nodes E, F, and G to a server over a cellular interface connection with a cell tower 672. Other methods of determining the distance of each of the assets 634, 636 from the master node 630, such as Received Signal-Strength Index (RSSI) based indoor localization techniques, also may be used.

In some embodiments, after determining its own location and the locations of the peripheral nodes, the master node 630 reports the location data the collected and optionally processed (e.g., either by the peripheral nodes peripheral nodes 634, 636 or the master node 630) sensor data to a server over a cellular communication path 670 on a cellular network 672.

Detecting a Condition of a Light Source

Figure 11:
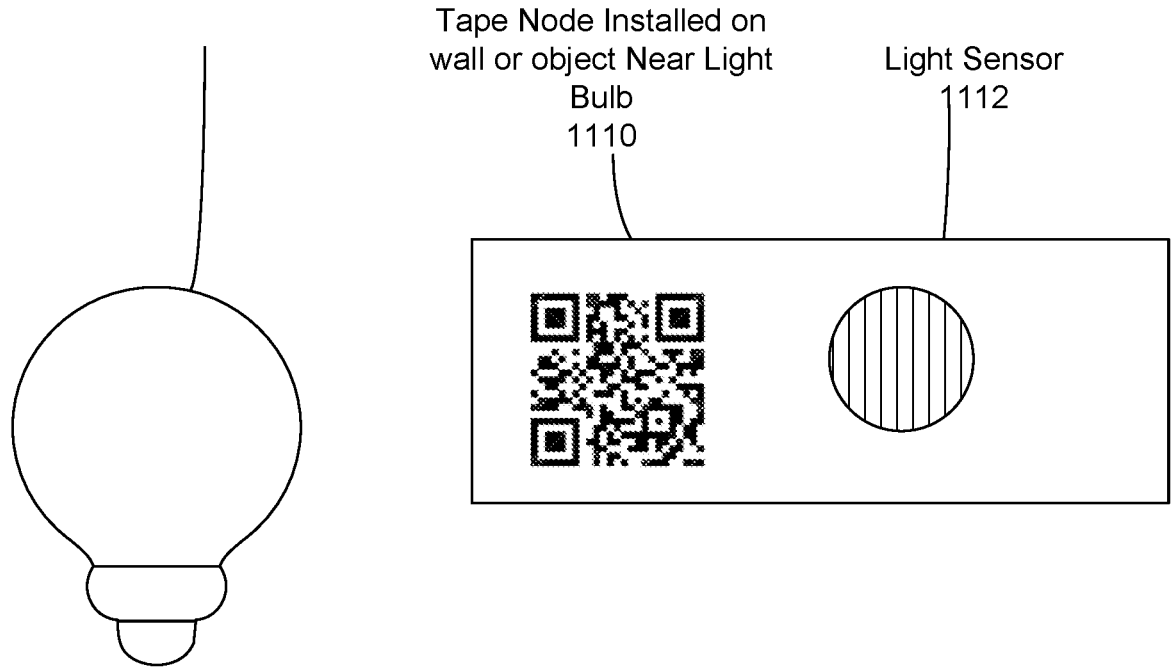
FIG. 11 shows an example of detecting a condition of a light bulb using a tape node installed near the light bulb, according to some embodiments.

FIG. 11 shows an example of detecting a condition of a light bulb 1101 using a tape node 1110 installed near the light bulb, according to some embodiments. The tape node 1110 includes a sensor 1112 that can detect when the light bulb is emitting light. The sensor 1112 may be a light sensor, an optical sensor, an infrared sensor, an acoustic sensor (if there is an associated audio cue for when light is being emitted from the light bulb), some other sensor, or some combination thereof. The tape node 1110 may be installed in a location in which light from the light bulb 1101 can reach the light sensor 1112, when the light bulb is emitting light. For example, the tape node 1110 may be adhered to a surface of a wall that is near the light bulb 1101 and in a direct line of sight of the light bulb 1101.

In some embodiments, the tape node 1110 determines a brightness, an age, an efficiency, or some other condition of the lightbulb 1101 based on the light received at its sensor 1112.

Figure 12A:
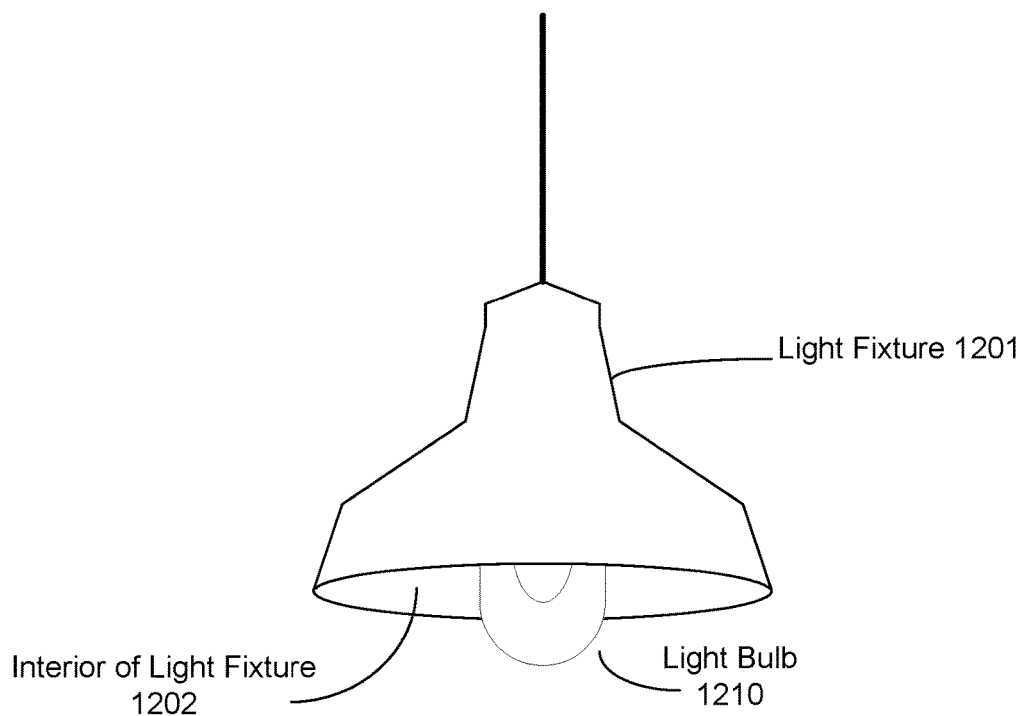
FIGS. 12A-12B shows an example of detecting a condition of a light bulb using a tape node installed on a light fixtures associated with the light bulb, according to some embodiments.
Figure 12B:
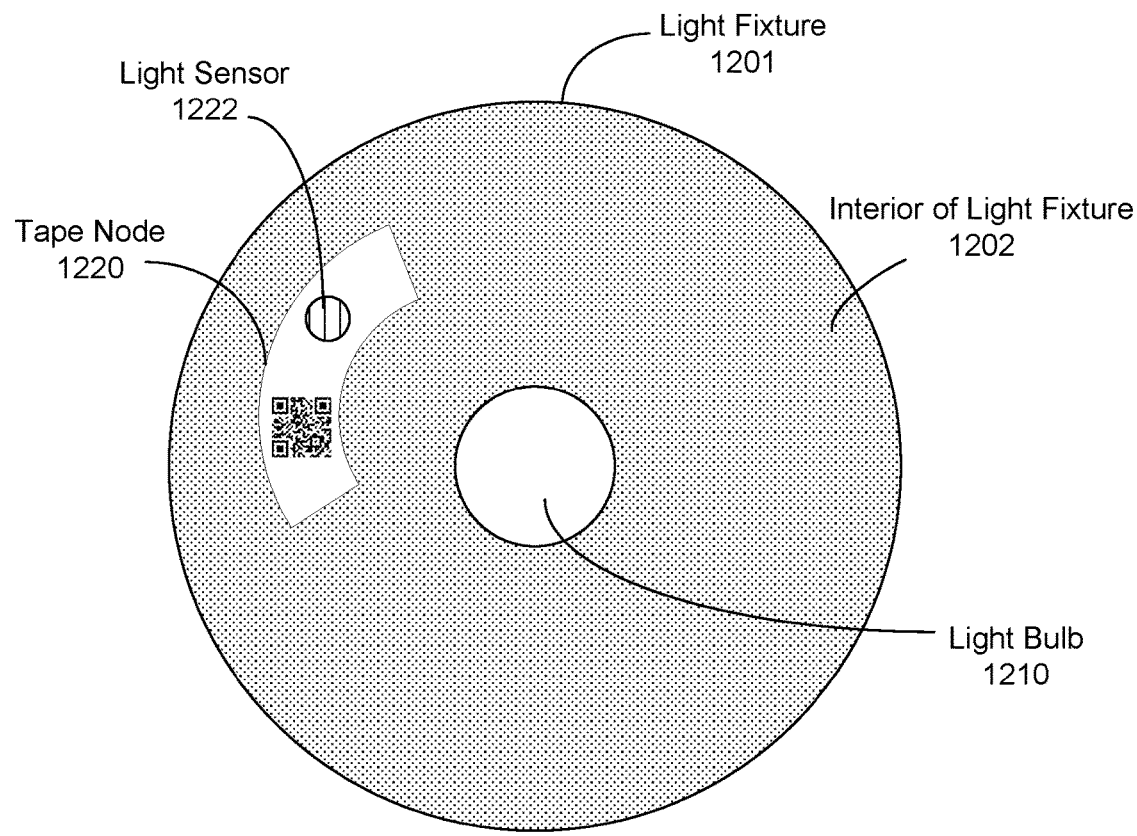

FIGS. 12A-12B show an example of detecting a condition of a light bulb 1210 using a tape node 1220 installed on a light fixture 1201 associated with the light bulb, according to some embodiments. The tape node may be adhered to an interior surface 1202 of the light fixture. When the light bulb is functioning correctly (i.e., emitting light), the light from the light bulb strikes the light sensor 1222 of the tape node 1220, and the tape node can determine that the light bulb 1210 is functioning correctly.

Figure 13:
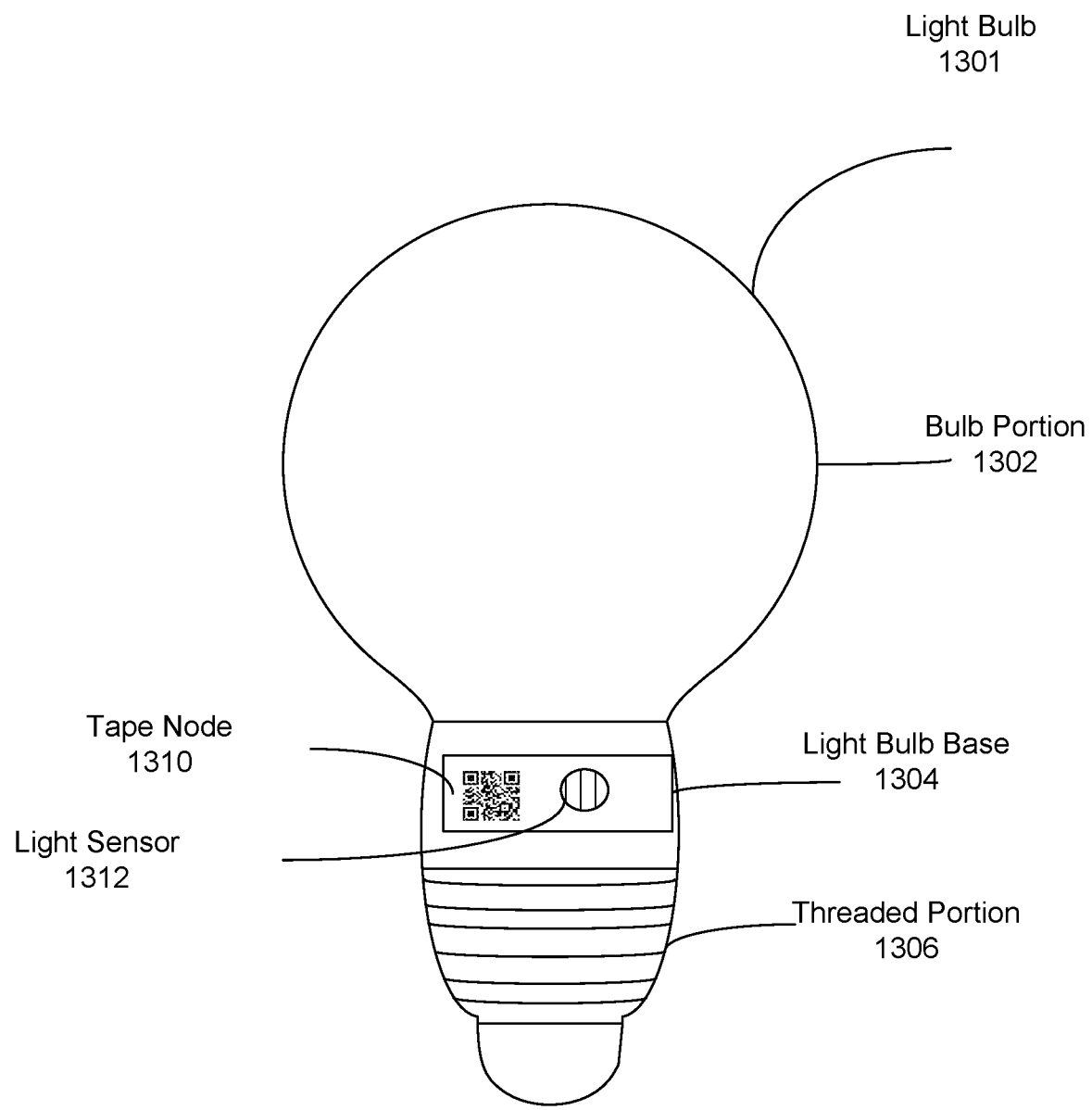
FIG. 13 shows an example of detecting a condition of a light bulb using a tape node installed on a part of the light bulb, according to some embodiments.

FIG. 13 shows an example of detecting a condition of a light bulb 1301 using a tape node 1310 installed on a part 1304 of the light bulb, according to some embodiments. The tape node may be adhered to the light bulb base 1304 in such a way that does not obstruct the light bulb 1301 from being installed or connected to a light fixture/ballast. The tape node 1310 may detect the condition (working/not working) based on receiving light at its sensor 1312.

Figure 14:
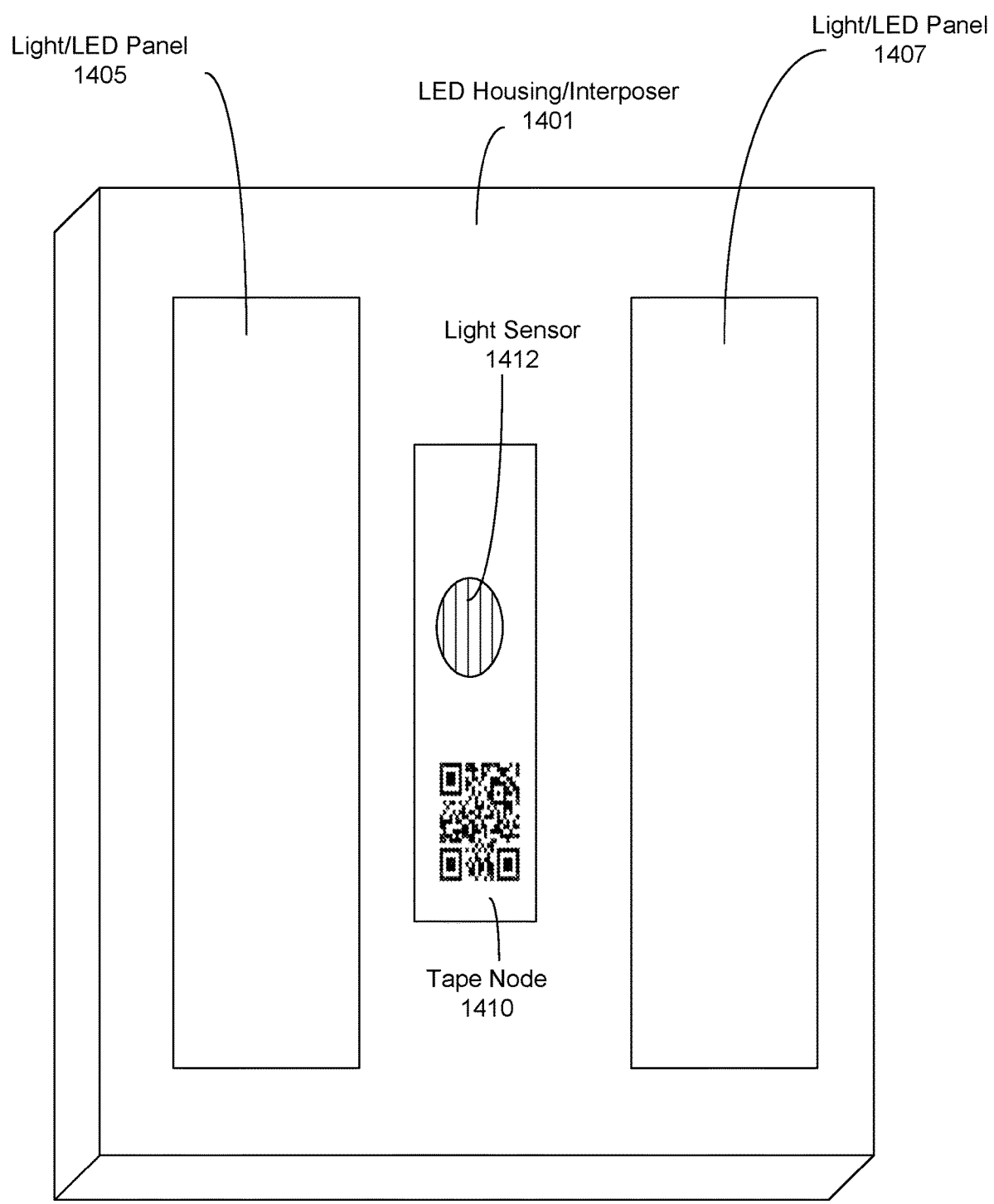
FIG. 14 shows an example of detecting a condition of a light or LED device using a tape node installed on an interposer or housing of the light or LED device.

FIG. 14 shows an example of detecting a condition of a light or LED device using a tape node 1410 installed on an interposer or housing 1401 of the light or LED device. The tape node 1410 is adhered to a surface of the interposer or housing 1401 in a position where light from the light/LED panels 1405, 1407 will be incident on the light sensor 1412 when the light/LED panels 1405, 1407 are functioning correctly. In some embodiments, the tape node 1410 is positioned in a different part of the light or LED device.

The tape nodes 1110, 1220, 1310, 1410 may detect events based on sensed light sensor data and transmit alerts to other nodes of the wireless IOT system 400, in response, according to some embodiments. The tape nodes 1110, 1220, 1310, 1410, may locally compute or make determinations on the condition of a respective light source and communicate the result of the determination, instead of sending sensor data to other nodes of the IOT system 400. For example, if one of the tape nodes 1110, 1220, 1310, 1410 detects no light emissions from the respective light source that the one tape node is coupled to, the one tape node may transmit an alert for someone to inspect or repair the light source. The one tape node may transmit an alert that is directly or indirectly received at a server of the IOT system 400, in some embodiments. The server may then instruct a user via client app on client device or a website to inspect or repair the respective light source. In other embodiments, the one tape node may transmit an alert to a nearby client device directly using a compatible wireless communication system of the one tape node. The alert may be displayed on the client app of the client device and may notify the user to inspect the light source associated with the one tape node. In some embodiments, the app on the user's client device may assist the user in navigating to the associated light bulb.

In some embodiments, the tape nodes 1110, 1220, 1310, 1410 detect a spectrum of the wavelengths of light detected by a respective light sensor. The condition of a respective light source may be determined based on the detected spectrum. For example, a light source may have a wavelength shift to emitted light, when the light source begins to degrade or malfunction. The tape nodes 1110, 1220, 1310, 1410 are configured to detect the wavelength shift, using a respective light sensor.

Figure 15:
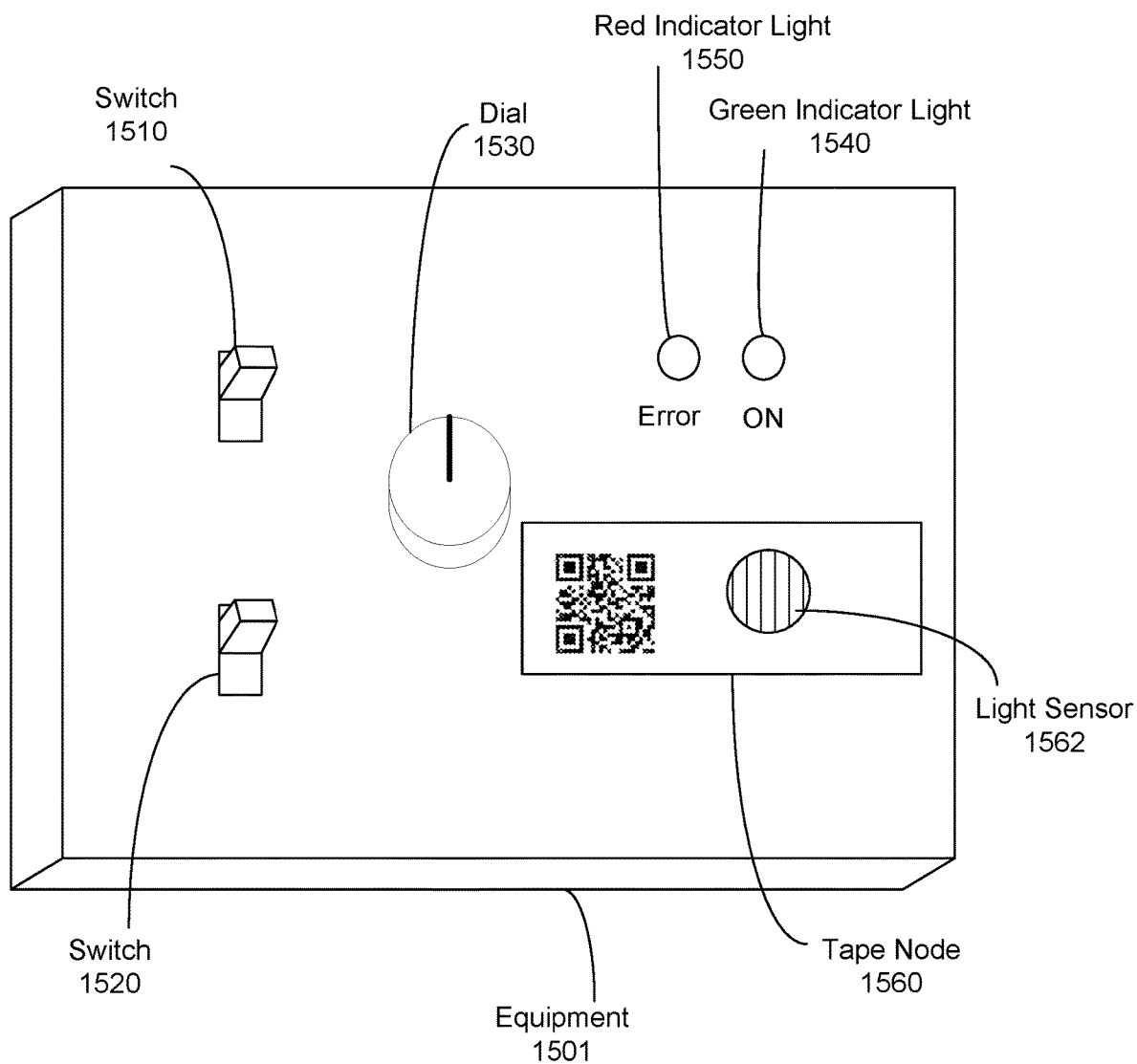
FIG. 15 shows an example of determining a status of a piece of equipment based on detecting a condition of one or more indicator lights on the equipment, according to some embodiments.

FIG. 15 shows an example of determining a status of a piece of equipment 1501 based on detecting a condition of one or more indicator lights on the equipment, according to some embodiments. In a case where a piece of equipment 1501 includes indicator light (e.g., green indicator light 1540 and red indicator light 1550), the tape node 1560 may detect a condition of the equipment based on light detected from the indicator lights. The tape node 1560, for example, may detect green light (e.g., light of wavelengths associated with green) at its light sensor 1562. The tape node 1560 may then determine that the equipment is functioning normally, since the green indicator light emits green light during normal operation.

If the tape node 1560 detects red light (e.g., light of wavelengths associated with red) at its light sensor 1562, the tape node 1560 determines that the equipment is malfunctioning, since the red indicator light 1550 emits red light when a malfunction occurs. In some embodiments, a user is alerted by the sensing system 400 when the malfunction is detected by the tape node 1560. Additionally, the user may be alerted by the sensing system 400 to perform actions to repair the malfunction such as adjusting the settings of the switches 1510, 1520 and/or the dial 1530.

In the above examples, each tape node 1110, 1220, 1310, 1410, 1560 is an embodiment of the adhesive tape platform 12. The tape node is a thin, flexible device that may serve a dual function as a wireless IOT device and an adhesive tape for labeling, adhering to, or sealing an asset, such as a light bulb or light emitting device.

Each tape node 1110, 1220, 1310, 1410, 1560 includes one or more wireless communication system for communicating with other wireless nodes of the wireless IOT system 400. For example, one of the tape node 1110, 1220, 1310, 1410, 1560 may wirelessly transmit light sensor data to one or more of a client device (e.g., a smartphone), another tape node, a gateway node, or a server of the IOT system 400. The tape nodes 1110, 1220, 1310, 1410, 1560 may transmit raw sensor data or they may transmit filtered or abridged versions of the sensor data to reduce battery usage, for example.

Computer Apparatus

Figure 16:
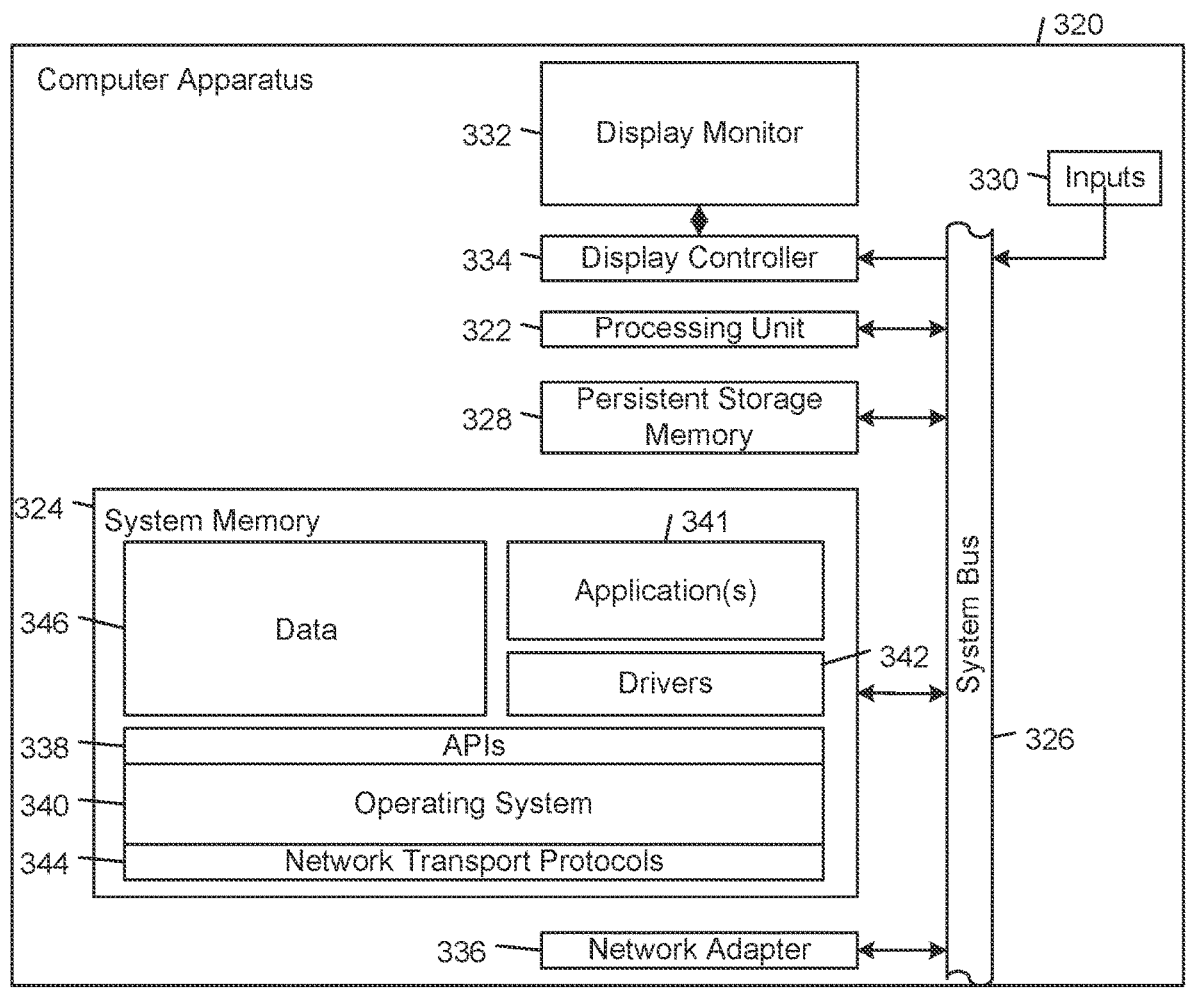
FIG. 16 shows an example embodiment of computer apparatus, according to some embodiments.

FIG. 16 shows an example embodiment of computer apparatus 320 that, either alone or in combination with one or more other computing apparatus, is operable to implement one or more of the computer systems described in this specification.

The computer apparatus 320 includes a processing unit 322, a system memory 324, and a system bus 326 that couples the processing unit 322 to the various components of the computer apparatus 320. The processing unit 322 may include one or more data processors, each of which may be in the form of any one of various commercially available computer processors. The system memory 324 includes one or more computer-readable media that typically are associated with a software application addressing space that defines the addresses that are available to software applications. The system memory 324 may include a read only memory (ROM) that stores a basic input/output system (BIOS) that contains start-up routines for the computer apparatus 320, and a random access memory (RAM). The system bus 326 may be a memory bus, a peripheral bus or a local bus, and may be compatible with any of a variety of bus protocols, including PCI, VESA, Microchannel, ISA, and EISA. The computer apparatus 320 also includes a persistent storage memory 328 (e.g., a hard drive, a floppy drive, a CD ROM drive, magnetic tape drives, flash memory devices, and digital video disks) that is connected to the system bus 326 and contains one or more computer-readable media disks that provide non-volatile or persistent storage for data, data structures and computer-executable instructions.

A user may interact (e.g., input commands or data) with the computer apparatus 320 using one or more input devices 330 (e.g. one or more keyboards, computer mice, microphones, cameras, joysticks, physical motion sensors, and touch pads). Information may be presented through a graphical user interface (GUI) that is presented to the user on a display monitor 332, which is controlled by a display controller 334. The computer apparatus 320 also may include other input/output hardware (e.g., peripheral output devices, such as speakers and a printer). The computer apparatus 320 connects to other network nodes through a network adapter 336 (also referred to as a "network interface card" or NIC).

A number of program modules may be stored in the system memory 324, including application programming interfaces 338 (APIs), an operating system (OS) 340 (e.g., the Windows® operating system available from Microsoft Corporation of Redmond, Washington U.S.A.), software applications 341 including one or more software applications programming the computer apparatus 320 to perform one or more of the steps, tasks, operations, or processes of the locationing and/or tracking systems described herein, drivers 342 (e.g., a GUI driver), network transport protocols 344, and data 346 (e.g., input data, output data, program data, a registry, and configuration settings).

Examples of the subject matter described herein, including the disclosed systems, methods, processes, functional operations, and logic flows, can be implemented in data processing apparatus (e.g., computer hardware and digital electronic circuitry) operable to perform functions by operating on input and generating output. Examples of the subject matter described herein also can be tangibly embodied in software or firmware, as one or more sets of computer instructions encoded on one or more tangible non-transitory carrier media (e.g., a machine readable storage device, substrate, or sequential access memory device) for execution by data processing apparatus.

The details of specific implementations described herein may be specific to particular embodiments of particular inventions and should not be construed as limitations on the scope of any claimed invention. For example, features that are described in connection with separate embodiments may also be incorporated into a single embodiment, and features that are described in connection with a single embodiment may also be implemented in multiple separate embodiments. In addition, the disclosure of steps, tasks, operations, or processes being performed in a particular order does not necessarily require that those steps, tasks, operations, or processes be performed in the particular order; instead, in some cases, one or more of the disclosed steps, tasks, operations, and processes may be performed in a different order or in accordance with a multi-tasking schedule or in parallel.

Other embodiments are within the scope of the claims.

Additional Configuration Information

The foregoing description of the embodiments of the disclosure have been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of detecting a condition of a light source comprising:
   adhering an adhesive tape platform in a vicinity of the light source;
   detecting light emitted from the light source that is incident to a light sensor of the adhesive tape platform;
   in response to the detecting light, determining that the light source is functioning correctly; and
   transmitting a report indicating that the light source is functioning to another node of an associated Internet of Things (IOT) system.

2. The method of claim 1, further comprising:
   in response to detecting a low level of light incident at the light sensor, determining that the light source is malfunctioning; and
   transmitting a report indicating that the light source is malfunctioning to the other node of the associated IOT system.

3. The method of claim 2, wherein the low level of light corresponds to an intensity of light detected incident at the light sensor being below a threshold intensity.

4. The method of claim 1, further comprising:
   measuring a spectrum of wavelengths for light incident at the light sensor;
   based on the measured spectrum of wavelengths, determining that a wavelength shift has occurred in the light incident at the light sensor;
   in response to determining the wavelength shift has occurred, determining that the light source has malfunctioned or degraded.

5. The method of claim 1, wherein the adhesive tape platform reports light sensor data to one or more wireless nodes of the associated IOT system.

6. The method of claim 5, wherein the light sensor data includes one or more of an intensity of light, wavelength of light, and a spectrum of wavelengths of detected light.

7. The method of claim 1, wherein the light source is a lightbulb.

8. The method of claim 1, wherein the adhesive tape platform is adhered to an interior of a light fixture associated with the lightbulb, and the light sensor is facing the lightbulb.

9. The method of claim 1, wherein the detecting the light from the light source is in response to receiving a report that an electrical current or voltage associated with the light source deviates from an expected value.

10. The method of claim 1, wherein the light source is one or more of a light bulb, a light emitting diode (LED), a lamp, a lantern, a burner, a fire, an organic LED (OLED), and a laser.

11. The method of claim 1, wherein the adhesive tape platform is adhered to an interposer of an LED light source.

12. A method of detecting a condition of an equipment asset comprising:
   adhering an adhesive tape platform to a portion of the equipment asset; and
   based on detecting light from an indicator light of the equipment asset at a light sensor of the adhesive tape platform, determining that the equipment asset is malfunctioning.

13. The method of claim 12, further comprising reporting the condition of the equipment asset to a wireless node of an associated wireless Internet of Things (IOT) system using a first wireless communication system of the adhesive tape platform.

14. The method of claim 13, further comprising:
  detecting a wavelength of light from an indicator light of the equipment asset incident at the light sensor;
  based on the detected wavelength of light, determining a condition of the equipment asset.

\* \* \* \* \*